US009455566B2

(12) United States Patent
Hiyama

(10) Patent No.: US 9,455,566 B2
(45) Date of Patent: Sep. 27, 2016

(54) DRIVE PROTECTION CIRCUIT, SEMICONDUCTOR MODULE, AND AUTOMOBILE

(71) Applicant: Mitsubishi Electric Corporation, Tokyo (JP)

(72) Inventor: Kazuaki Hiyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/650,541

(22) PCT Filed: Dec. 21, 2012

(86) PCT No.: PCT/JP2012/083320
§ 371 (c)(1),
(2) Date: Jun. 8, 2015

(87) PCT Pub. No.: WO2014/097485
PCT Pub. Date: Jun. 26, 2014

(65) Prior Publication Data
US 2015/0311692 A1    Oct. 29, 2015

(51) Int. Cl.
| | |
|---|---|
| *H02K 17/32* | (2006.01) |
| *H02H 3/093* | (2006.01) |
| *H02M 1/08* | (2006.01) |
| *H03K 17/082* | (2006.01) |
| *H02M 1/32* | (2007.01) |
| *H03K 17/16* | (2006.01) |

(52) U.S. Cl.
CPC ............ *H02H 3/093* (2013.01); *H02M 1/08* (2013.01); *H02M 1/32* (2013.01); *H03K 17/0828* (2013.01); *H03K 17/168* (2013.01); *H03K 17/166* (2013.01)

(58) Field of Classification Search
CPC ... H03K 17/166; H03K 17/163; H02M 1/32; H02H 3/093; H02P 6/14
See application file for complete search history.

(56) References Cited

U.S. PATENT DOCUMENTS 5,375,029 A    12/1994  Fukunaga et al.
2009/0128974 A1*  5/2009  Ishikawa ............ H03K 17/0828
                                                        361/93.1

FOREIGN PATENT DOCUMENTS

| JP | H05-161342 A | 6/1993 |
| JP | 2999887 B | 1/2000 |
| JP | 2003-134797 A | 5/2003 |
| JP | 2012-186937 A | 9/2012 |

OTHER PUBLICATIONS

Notification Concerning Transmittal of International Preliminary Report on Patentability and Translation of Written Opinion of the International Searching Authority; PCT/JP2012/083320 issued on Jul. 2, 2015.
International Search Report; PCT/JP2012/083320; Mar. 26, 2013.

* cited by examiner

*Primary Examiner* — Karen Masih
(74) *Attorney, Agent, or Firm* — Studebaker & Brackett PC

(57) ABSTRACT

It is an object of the present invention to provide a technology capable of reliably suppressing a surge voltage even in a case where noise having a small pulse width is generated. A drive protection circuit that drives and protects a switching element includes a gate driving circuit that drives the switching element in response to a gate driving signal and an overcurrent protection circuit that operates a soft cutoff circuit upon an overcurrent of the switching element, the soft cutoff circuit causing the switching element to transition from ON to OFF at a switching speed slower than that of the gate driving circuit. In the drive protection circuit, in a case where a pulse width of ON of the gate driving signal is less than or equal to a response time of the overcurrent protection circuit, the drive protection circuit operates the soft cutoff circuit to cause the switching element to transition from ON to OFF, regardless of the overcurrent.

8 Claims, 21 Drawing Sheets

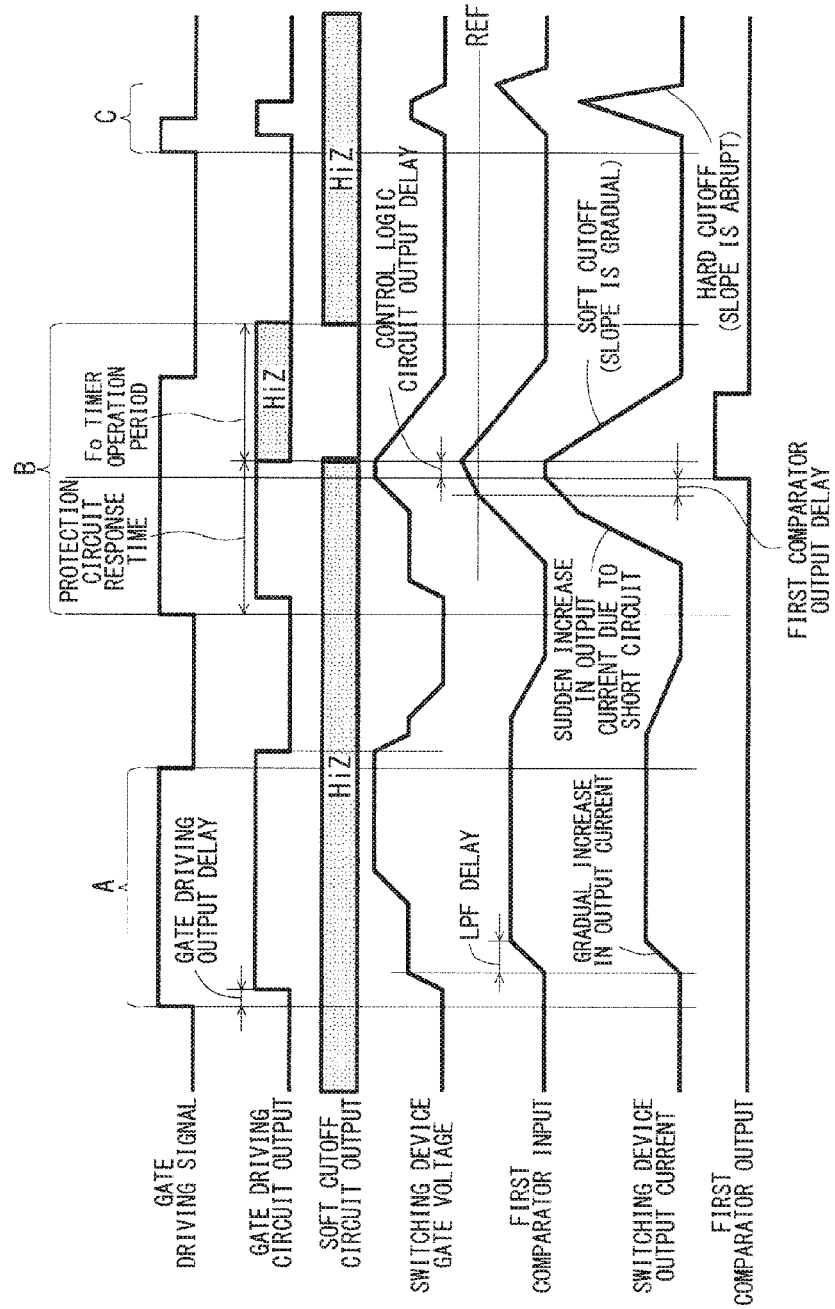

| INPUT | | OUTPUT | | | ELEMENT STATES | | | | REMARKS |
|---|---|---|---|---|---|---|---|---|---|
| IN | SC | SOFT | ON | OFF | Q1 | Q2 | Q3 | Q4 | |
| L | L | L | H | H | OFF | OFF | ON | OFF | IGBT OFF |
| H | L | L | L | L | OFF | ON | OFF | ON | IGBT ON |
| H | H | H | H | L | ON | OFF | OFF | OFF | SOFT CUTOFF START |
| — | H | L | H | H | OFF | OFF | ON | OFF | SOFT CUTOFF |

F I G . 8
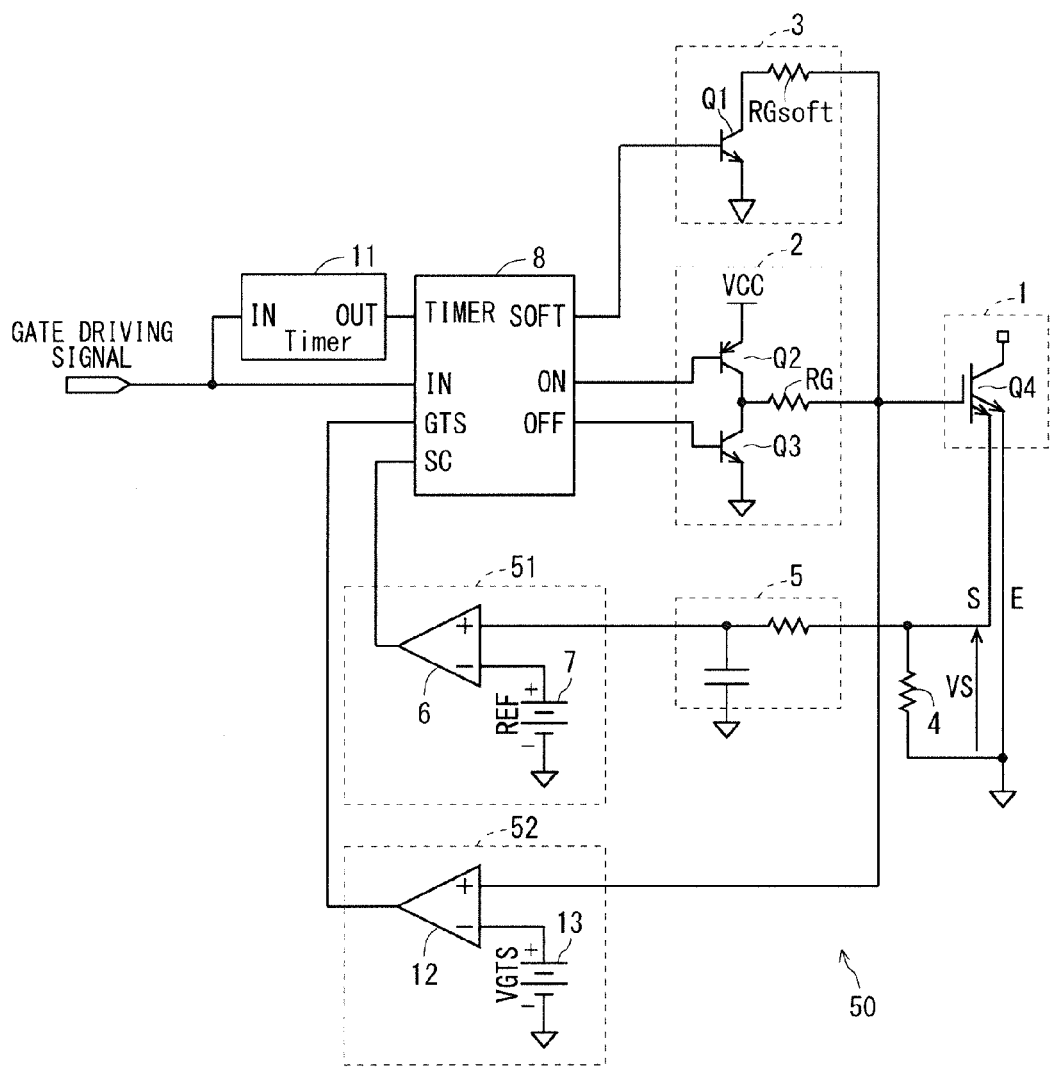

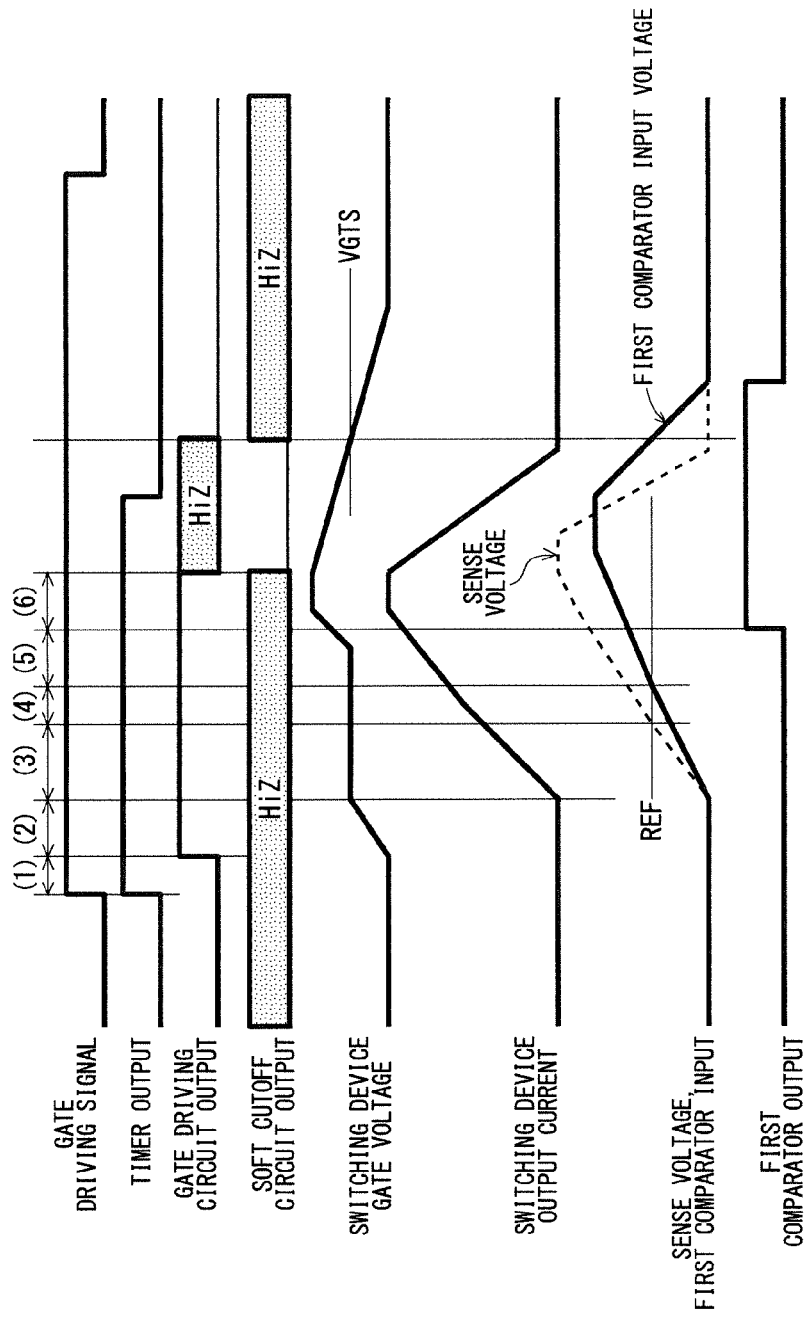

| INPUT | | | OUTPUT | | | ELEMENT STATES | | | | REMARKS |
|---|---|---|---|---|---|---|---|---|---|---|
| IN | SC | TIMER | SOFT | ON | OFF | Q1 | Q2 | Q3 | Q4 | |
| L | L | L | L | H | H | OFF | OFF | ON | OFF | IGBT OFF |
| H | L | - | L | L | L | OFF | ON | OFF | ON | IGBT ON |
| H | H | - | H | H | L | ON | OFF | OFF | OFF | SOFT CUTOFF START |
| L | H | - | L | H | H | OFF | OFF | ON | OFF | IGBT OFF |
| L | L | H | H | H | L | ON | OFF | OFF | OFF | SOFT CUTOFF |

F I G . 1 3
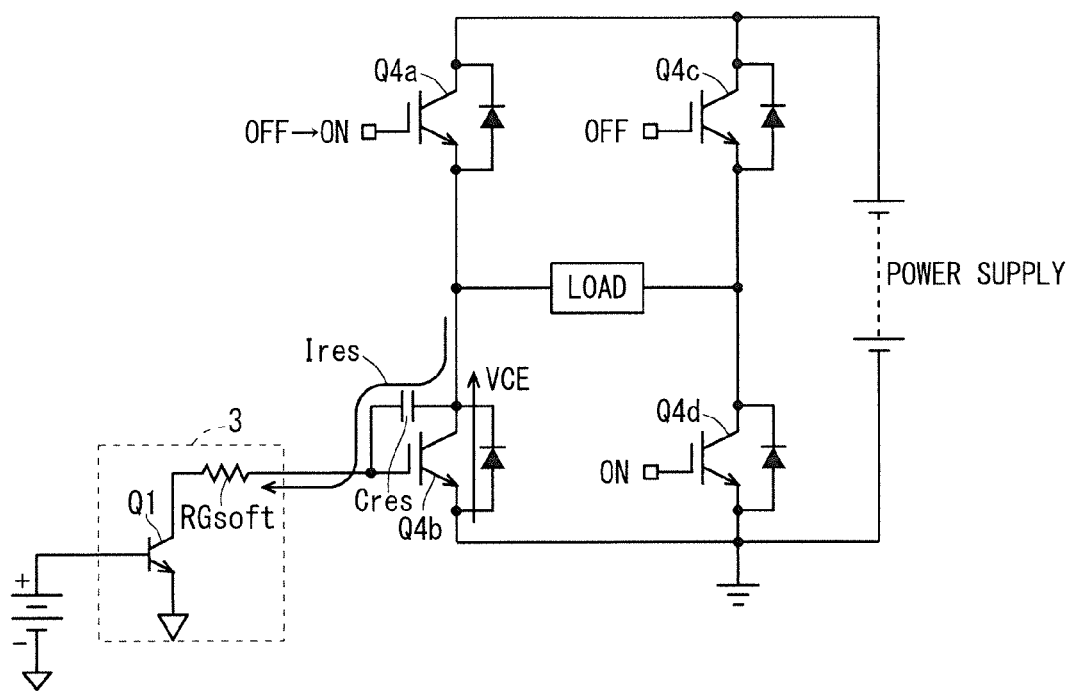

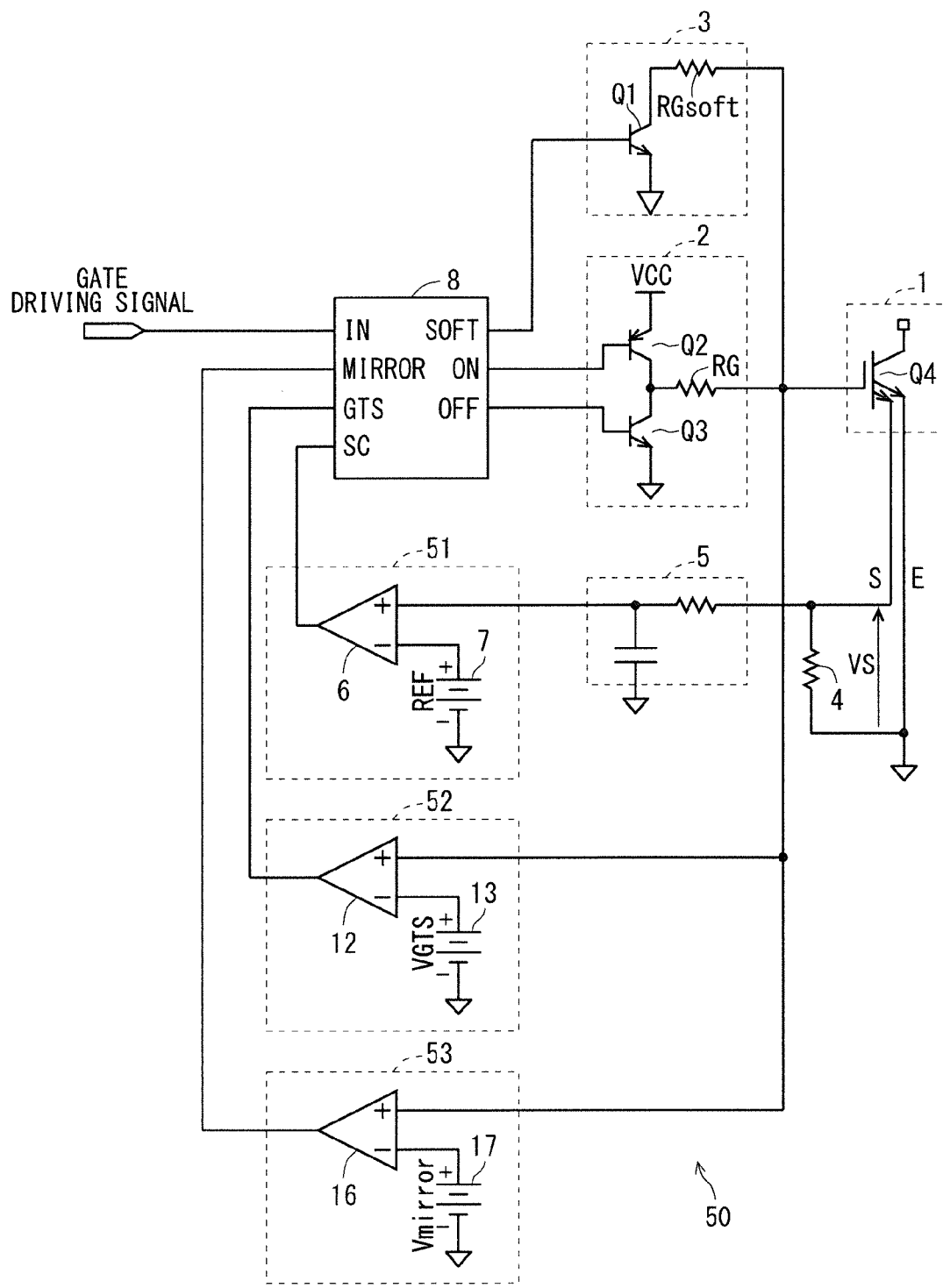
F I G . 1 4

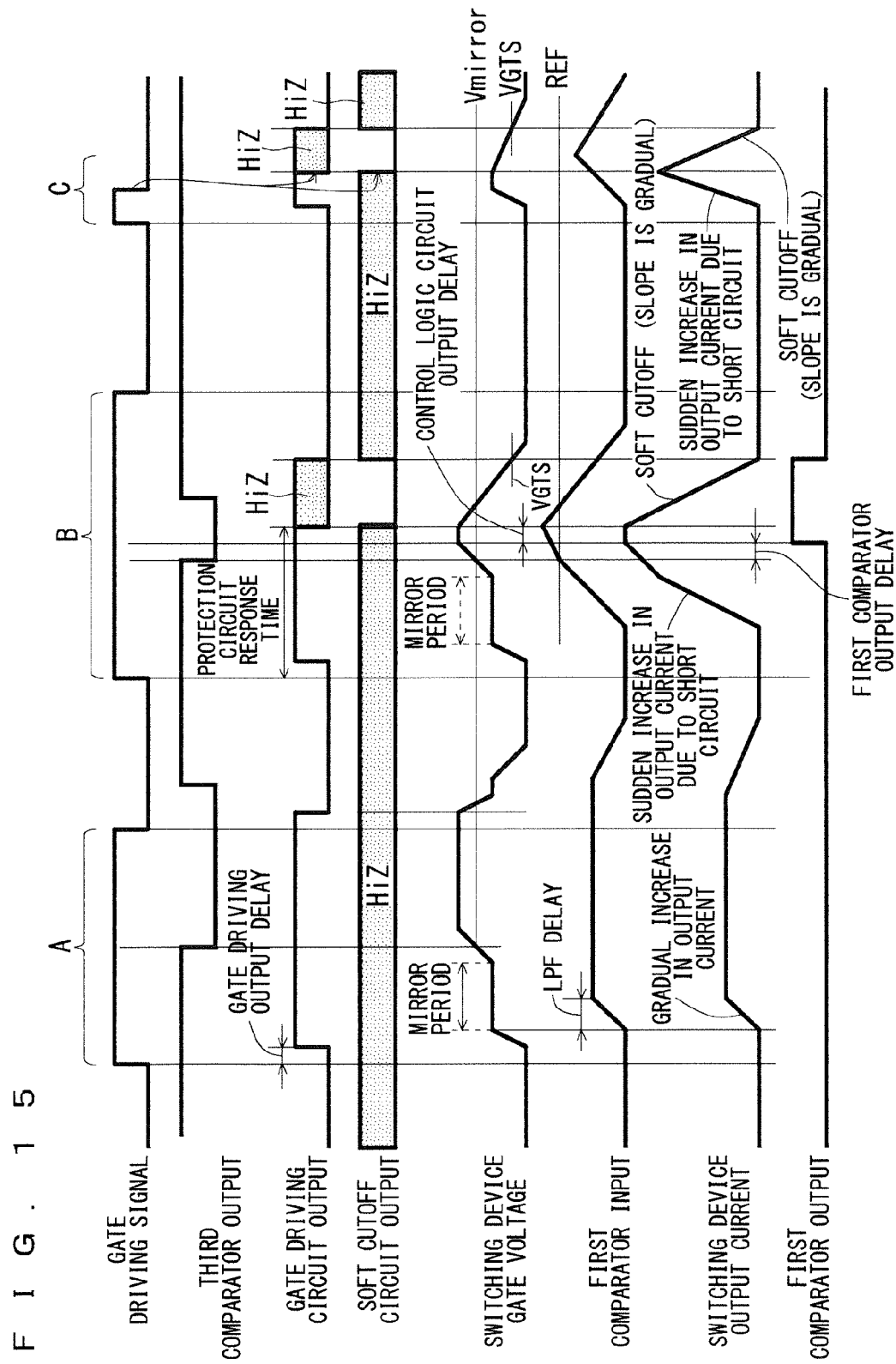

F I G . 2 1
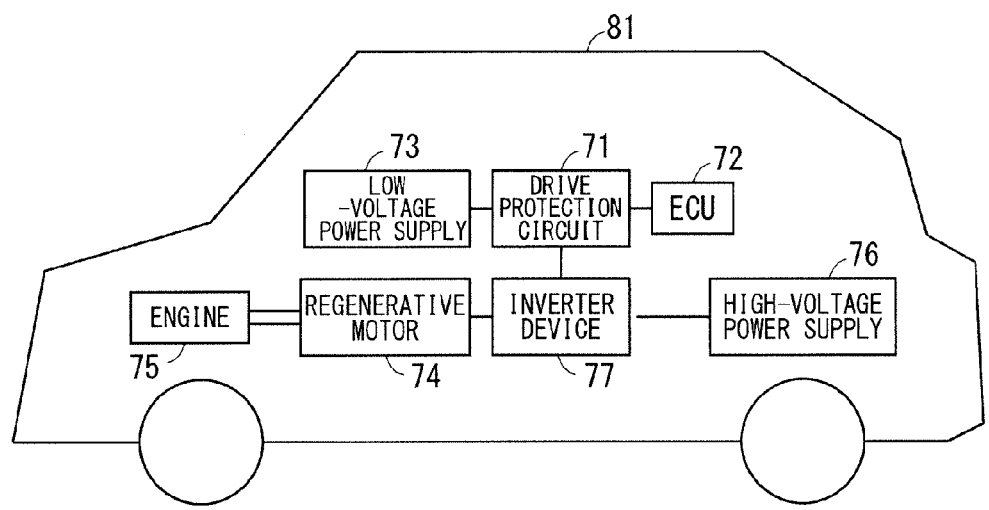

DRIVE PROTECTION CIRCUIT, SEMICONDUCTOR MODULE, AND AUTOMOBILE

TECHNICAL FIELD

The present invention relates to a drive protection circuit that drives and protects a switching element such as a voltage-controlled semiconductor switching element of a power module, to a semiconductor module, and to an automobile.

BACKGROUND ART

In a switching circuit formed of a semiconductor switching element such as MOSFET, IGBT, and SiCMOSFET, in a case where an output current of the semiconductor switching element becomes excessive due to irregularities such as an overload and a load short circuit (for example, arm short circuit that simultaneously turns ON high-side and low-side semiconductor switching elements), it is known that turning OFF the switching element at an early switching speed generates a surge voltage that adversely influences the switching element.

Thus, the above-mentioned switching circuit has been developed to include a soft cutoff circuit that enables turn-off (so-called soft cutoff) of the semiconductor switching element at a switching speed slower than usual in the case where the output current becomes excessive (for example, see Patent Document 1). The soft cutoff circuit can suppress the surge voltage.

PRIOR ART DOCUMENT

Patent Document

Patent Document 1: Japanese Patent Application Laid-Open No. 2003-134797

SUMMARY OF INVENTION

Problems to be Solved by the Invention

On the other hand, with an increase in the switching speed of the switching element, noise having a small pulse width may be superimposed on an input signal for driving the switching circuit. The pulse width of the noise is typically smaller (shorter) than a response time needed until the soft cutoff circuit starts a protection operation, so that the switching element is sometimes turned OFF at the normal switching speed before the protection operation starts.

Thus, when the state in which the switching element is turned OFF at the normal switching speed due to the noise unintentionally overlaps the state in which the arm short circuit occurs, the soft cutoff circuit fails to provide protection and to suppress the surge voltage. As a result, a problem arises that an adverse influence on the switching element by the surge voltage cannot be suppressed.

The present invention has been made in view of the above mentioned problems, and an object thereof is to provide a technology capable of reliably suppressing a surge voltage even in a case where noise having a small pulse width is generated.

Means to Solve the Problems

A drive protection circuit according to the present invention that drives and protects a switching element includes a drive circuit that drives the switching element in response to an input signal and an overcurrent protection circuit that operates a soft cutoff circuit upon an overcurrent of the switching element, the soft cutoff circuit causing the switching element to transition from ON to OFF at a switching speed slower than that of the drive circuit. In a case where a pulse width of ON of the input signal is less than or equal to a response time of the overcurrent protection circuit, the drive protection circuit operates the soft cutoff circuit to cause the switching element to transition from ON to OFF, regardless of the overcurrent.

Effects of the Invention

The present invention operates the soft cutoff circuit regardless of the overcurrent in the case where the pulse width of ON of the input signal is less than or equal to the response time of the overcurrent protection circuit. Therefore, even in a case where noise having a small pulse width is generated, the soft cutoff circuit can cause the switching element to transition from ON to OFF regardless of the overcurrent, so that a surge voltage can be reliably suppressed.

BRIEF DESCRIPTION OF DRAWINGS

FIG. 2 is a diagram illustrating an operation timing of the related drive protection circuit.

FIG. 8 is a circuit diagram illustrating a configuration of a drive protection circuit according to a first embodiment.

FIG. 10 is a diagram illustrating an operation timing of the drive protection circuit according to the first embodiment.

FIG. 13 is a diagram illustrating effects obtained by the drive protection circuit according to the first embodiment.

FIG. 14 is a circuit diagram illustrating a configuration of a drive protection circuit according to a second embodiment.

FIG. 15 is a diagram illustrating an operation timing of the drive protection circuit according to the second embodiment.

FIG. 21 is a block diagram illustrating a configuration of an automobile including a drive protection circuit according to a fourth embodiment.

DESCRIPTION OF EMBODIMENTS

First Embodiment

Figure 1:
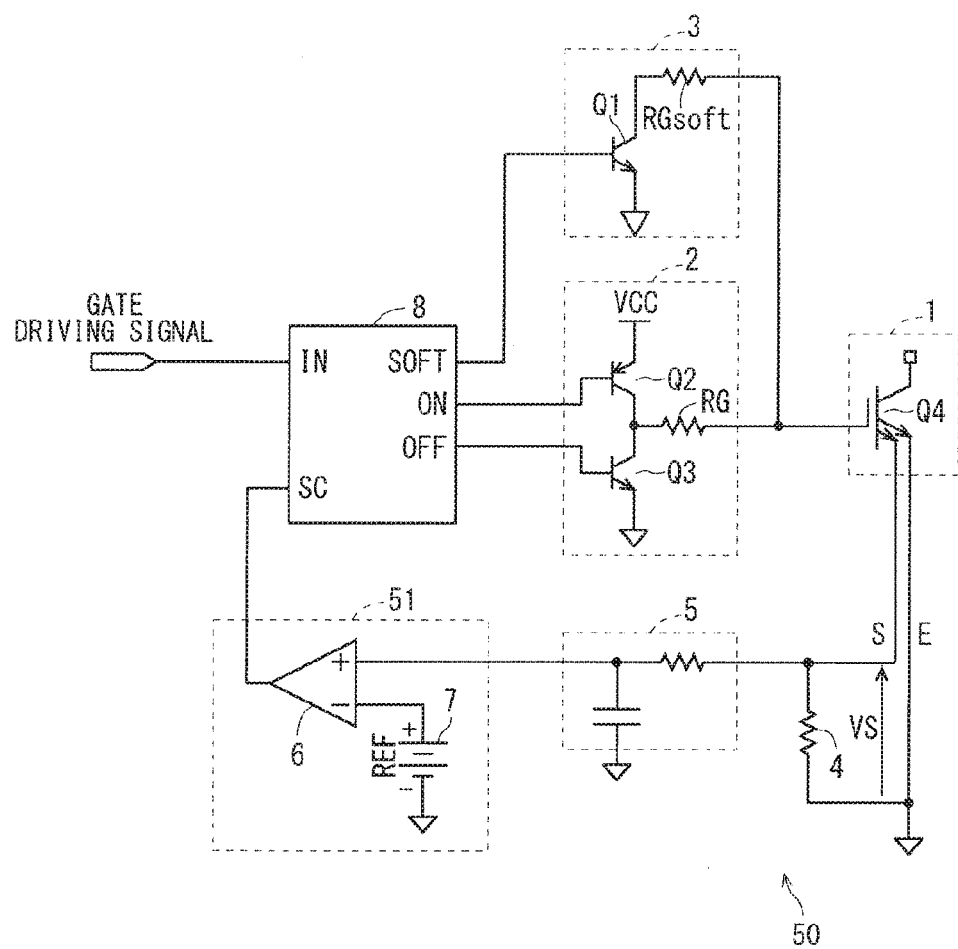
FIG. 1 is a circuit diagram illustrating a configuration of a related drive protection circuit.

First, prior to description of a drive protection circuit according to a first embodiment of the present invention, a drive protection circuit related to that (hereinafter referred to as a "related drive protection circuit") will be described. FIG. 1 is a circuit diagram illustrating a configuration of the related drive protection circuit, and FIG. 2 is a diagram illustrating an operation timing of the related drive protection circuit.

The related drive protection circuit is a circuit that drives and protects a switching element Q4 of a switching device 1 and is configured to include, as shown in FIG. 1, a gate driving circuit (drive circuit) 2, a soft cutoff circuit 3, a sense resistor 4, a low pass filter (LPF) 5, a first comparator 6, a power supply 7 having a reference voltage REF, and a control logic circuit 8 collectively controlling these.

Among these structural components, the structural components except for the above-mentioned gate driving circuit 2 (namely, the soft cutoff circuit 3, the sense resistor 4, the low pass filter 5, the first comparator 6, the power supply 7, and the control logic circuit 8) form an overcurrent protection circuit 50. The overcurrent protection circuit 50, which will be described in detail later, operates the soft cutoff circuit 3 upon an overcurrent of the switching element Q4, to thereby protect the switching element Q4 from the overcurrent.

Next, the structural components of the related drive protection circuit will be described in detail. Hereinafter, it will be described that the switching element Q4 is assumed to be formed of an IGBT, and ON and OFF of the switching element Q4 may be described as ON and OFF of the IGBT or ON and OFF of the switching device 1.

The gate driving circuit 2 is configured to include switching elements Q2, Q3 and a resistor RG. As an example herein, the switching elements Q2, Q3 are formed of a bipolar transistor. In a case where the related drive protection circuit normally operates (period A shown in FIG. 2), the gate driving circuit 2 drives the switching element Q4 in response to a gate driving signal (input signal of the related drive protection circuit) under the control of the control logic circuit 8. Specifically, the gate driving circuit 2 selectively outputs an ON-voltage and an OFF-voltage to a gate of the switching element Q4 in response to ON (H: high) and OFF (L: low) of the gate driving signal and drives the switching element Q4 with this output. On the other hand, in a case where the overcurrent is detected as described below (period B shown in FIG. 2), the switching elements Q2, Q3 are turned OFF under the control of the control logic circuit 8, bringing the gate driving circuit 2 to a high impedance (HiZ) state that does not influence the switching element Q4 and the other structural components.

The soft cutoff circuit 3 is configured to include a switching element Q1 and a resistor $RG_{soft}$. In a case where the related drive protection circuit normally operates (period A shown in FIG. 2), the switching element Q1 is turned OFF under the control of the control logic circuit 8, bringing the soft cutoff circuit 3 to the HiZ state that does not influence the switching element Q4 and the other structural components. On the other hand, in a case where the overcurrent is detected (period B shown in FIG. 2), the switching element Q1 is turned ON under the control of the control logic circuit 8, whereby the soft cutoff circuit 3 causes the switching element Q4 to transition from ON to OFF.

Here, the resistor $RG_{soft}$ of the soft cutoff circuit 3 having a resistance value greater than that of the resistor RG of the gate driving circuit 2 is used. Thus, a decrease per unit time in the gate voltage for causing the switching element Q4 to transition from ON to OFF using the soft cutoff circuit 3 is more gradual than a decrease in the transition using the gate driving circuit 2. Consequently, in the case where the overcurrent is detected, the related drive protection circuit operates the soft cutoff circuit 3 even with the gate driving signal being ON (H) and performs a soft cutoff for causing the switching element Q4 to transition from ON to OFF at a switching speed slower than that of the gate driving circuit 2.

The sense resistor 4 is connected to a sense terminal S of the switching element Q4 in which several thousandths to several ten thousandths of a sense current flows with respect to an emitter. The sense resistor 4 converts the sense current to a sense voltage VS.

A description is given here of a configuration that the switching element Q4 has the sense terminal S, but in the configuration without the sense terminal S, a shunt resistor for current detection may be connected between a ground and an emitter terminal E and a voltage obtained by converting an emitter current may be used instead of the sense voltage VS. Then, a resistance value of the sense resistor 4 (or the shunt resistor) may be set such that a voltage drop in the sense resistor 4 (or the shunt resistor) exceeds the reference voltage REF of the power supply 7 in a case where an output current of the switching element Q4 exceeds a rated value.

The low pass filter 5 removes noise components superimposing on the sense voltage VS converted by the sense resistor 4 and outputs the sense voltage VS after the removal to the first comparator 6.

The first comparator 6 compares, with respect to small and large, the sense voltage VS from the low pass filter 5 and the reference voltage REF of the power supply 7, and outputs a signal in accordance with the comparison result to the control logic current 8. Here, the first comparator 6 outputs L to the control logic circuit 8 in a case where the sense voltage is less than or equal to the reference voltage REF and outputs H to the control logic circuit 8 in a case where the sense voltage exceeds the reference voltage REF. In addition, the reference voltage REF is set, for example, less than or equal to 1 V herein such that the voltage drop in the sense resistor 4 (or the shunt resistor) does not influence the operation of the switching element Q4.

In this manner, the first comparator 6 and the power supply 7 form an overcurrent detector 51 that detects whether or not the output current of the switching element Q4 is excessive.

The control logic current 8 controls the gate driving circuit 2 and the soft cutoff circuit 3 on the basis of the gate driving signal and the output from the first comparator 6. Specifically, the control logic circuit 8 performs a normal operation that turns ON and OFF the switching element Q4 using the gate driving circuit 2 in accordance with ON and OFF of the gate driving signal in the case where the control logic circuit 8 receives L from the first comparator 6 (the case where the output current of the switching element Q4 is not excessive and the sense voltage VS is less than or equal to the reference voltage REF, as shown in the period A in FIG. 2).

On the other hand, the control logic circuit 8 causes the switching element Q4 to transition from ON to OFF, using the soft cutoff circuit 3, at the switching speed slower than that of the gate driving circuit 2 even with the gate driving signal being ON in the case where the control logic circuit 8 receives H from the first comparator 6 (the case where the output current of the switching element Q4 is excessive and the sense voltage VS exceeds the reference voltage REF, as shown in the period B in FIG. 2).

In other words, the overcurrent protection circuit 50 operates the soft cutoff circuit 3 when the overcurrent is detected in the overcurrent detector 51. The related drive protection circuit including the overcurrent protection circuit 50 can suppress the surge voltage. Moreover, the related drive protection circuit brings the gate driving circuit 2 to the HiZ state in the operation of the soft cutoff circuit 3 and brings the soft cutoff circuit 3 to the HiZ state in the operation of the gate driving circuit 2, under the control of the control logic circuit 8. This suppresses that the operations of the gate driving circuit 2 and the soft cutoff circuit 3 influence each other.

In addition, as shown in FIG. 2, just because the gate driving circuit 2 and the soft cutoff circuit 3 apply voltage to the gate of the switching element Q4 does not mean that a gate voltage VGE of the switching element Q4 follows the applied voltage from those circuits instantly to be the same voltage as the applied voltage. For example, as described below, a phenomenon in which the gate voltage of the switching element Q4 remains at a voltage value different from the applied voltage for a while is seen in a mirror period upon the turn-on of the switching element Q4.

Figures 3A, 3B:
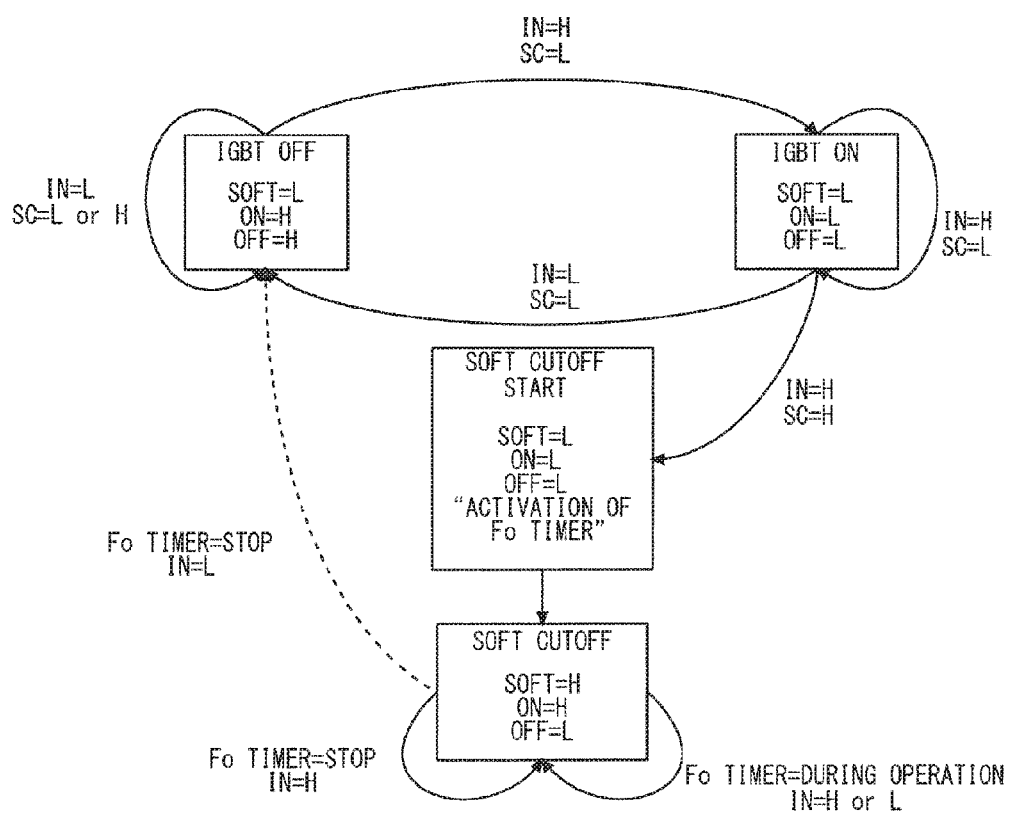
FIGS. 3A and 3B are diagrams illustrating an operation of the related drive protection circuit.

FIG. 3A is a truth table of the control logic circuit 8 according to the related drive protection circuit, and FIG. 3B is a state transition diagram of the control logic circuit 8. As shown in FIG. 3A and FIG. 3B, the control logic circuit 8 has four states that are an IGBT OFF (switching element Q4 OFF), an IGBT ON (switching element Q4 ON), a soft cutoff start, and a soft cutoff.

In the normal operation (SC=L), a drive using the gate driving circuit 2 is performed and the IGBT ON-state and the IGBT OFF-state are switched therebetween. Then, when the output (SC) of the first comparator 6 is H in the IGBT ON-state, the control logic circuit 8 transitions from the IGBT ON-state to the soft cutoff start state.

After the transition to the soft cutoff start state, the control logic circuit 8 turns OFF the switching elements Q2, Q3 of the gate driving circuit 2 and turns ON the switching element Q1 of the soft cutoff circuit 3. Thus, the soft cutoff circuit 3 operates to cause the switching element Q4 to transition from ON to OFF at the low switching speed. Moreover, the control logic circuit 8 activates a built-in abnormality timer (hereinafter referred to as a "$F_O$ timer") (not shown) that counts an abnormal signal (hereinafter referred to as a fault output signal) upon occurrence of the overcurrent for a fixed period of time to start the count. After the operation above, the control logic circuit 8 transitions from the soft cutoff start state to the soft cutoff state.

After the transition to the soft cutoff state, the control logic circuit 8 maintains the soft cutoff state until the $F_O$ timer stops (the count for the fixed period of time ends) and the gate driving signal is brought into OFF (IN=L). In other words, the related drive protection circuit maintains the soft cutoff state without receiving the gate driving signal during the operation of the $F_O$ timer. Then, after the $F_O$ timer stops and the gate driving signal is brought into OFF, the control logic circuit 8 transitions to the IGBT OFF-state as shown by a dashed arrow. In addition, as described above, the soft cutoff state is maintained for the fixed period of time using the $F_O$ timer regardless of the output of the first comparator 6 because a fixed period of time is needed to transmit occurrence of abnormalities to a higher system that generates the gate driving signal and a period of time also needs to be secured until the transition of the switching element Q4 to OFF.

Here, as shown in the period B in FIG. 2, there is a fixed time lag, such as a "first comparator output delay" and a "control logic circuit output delay," from the time in which an input voltage of the first comparator 6 exceeds the reference voltage REF to the time in which the output is reversed. Moreover, a "gate driving output delay," an "LPF delay," or the like also occurs in a signal path from the time in which the gate driving signal is H to the time in which the sense voltage VS is input to the first comparator 6.

In other words, a fixed response time (=gate driving output delay+LPF delay+first comparator output delay+control logic circuit output delay) of approximately a few μ seconds, for example, is needed from the time in which the abnormal gate driving signal is input to the related drive protection circuit to the time in which the overcurrent protection circuit 50 starts the operation of protecting the switching element Q4.

Figure 4:
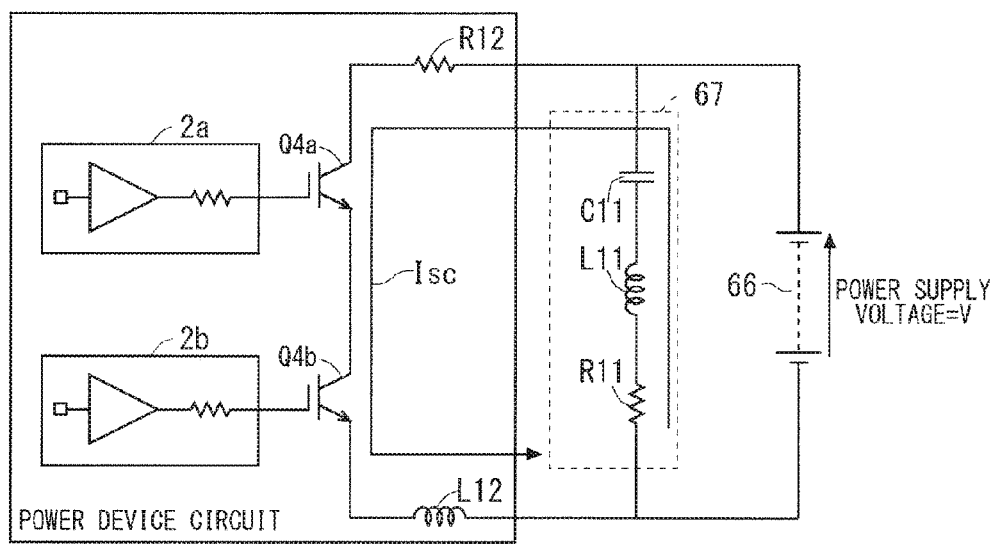
FIG. 4 is a diagram illustrating an arm short circuit.

Next, FIG. 4 illustrates a diagram of a circuit in which switching elements Q4$a$, Q4$b$ corresponding to the switching element Q4 described above are bridge-connected as high-side and low-side switching elements, respectively. In addition, gate driving circuits 2$a$, 2$b$ are circuits that correspond to the gate driving circuit 2 described above and drive the switching elements Q4$a$, Q4$b$, respectively. Moreover, the switching element Q4$a$ is connected to a power supply 66 through an inner resistor R12 of a power device circuit, and the switching element Q4$b$ is connected to the power supply 66 through an inner inductance L12 of the power device circuit.

Here, a power supply outputting a voltage in which an alternating-current voltage is full-wave rectified is used as the power supply 66. To smooth the full-wave rectified waveform voltage being output from the power supply 66, a DC-Link capacitor 67 is connected to the power supply 66 in the circuit shown in FIG. 4, the DC-Link capacitor 67 being represented by an equivalent circuit in which a capacitor (capacitance) C11, an inner inductance L11 of the capacitor C11, and an inner resistor R11 of the capacitor C11 are connected in series. In addition, the DC-Link capacitor 67 is used for suppressing a resistance inside a battery and a voltage fluctuation due to a wiring impedance between the battery and a switching element circuit in a vehicle, such as an electric-powered automobile, having the battery as a power supply.

In case where an arm short circuit (short-time short circuit) that simultaneously and instantaneously brings the switching elements Q4$a$, Q4$b$ to the ON-state occurs in the circuit shown in FIG. 4 having such configuration, a short-circuit current $L_{sc}$ indicated by a following expression (1) flows through the bridge (switching elements Q4$a$, Q4$b$).

[Math 1]

$$I_{SC} = \frac{V}{R}\left(1 - e^{-\frac{R}{L}t}\right) \quad (1)$$

t: arm short circuit duration

R=R11+R12+R13+R14

R13, R14=ON-resistances of Q4a, Q4b

L=L11+L12

Here, for example, in a case where a total sum R of resistance components in a path through which the short-circuit current $I_{SC}$ flows is 34 mΩ, a total sum L of parasitic inductances in the path is 25 nH, and a power supply voltage V is 40 V, the short-circuit $I_{SC}$ after 1 µs since occurrence of the short circuit is 8745 A by calculation using the expression (1) above. This indicates that the short-circuit current $I_{SC}$ is extremely great even if the short-circuit time is short.

In the case where the relatively great short-circuit current $I_{SC}$, namely, the output current of the switching element Q4 is generated, the transition of the switching element Q4 from ON to OFF at the normal switching speed by the gate driving circuit 2 generates the surge voltage, resulting in an adverse influence on the switching element Q4.

Thus, in the configuration using the above-mentioned related drive protection circuit, the gate driving signal properly controlled by the higher system or the like is normally input to the related drive protection circuit to prevent the state in which the arm short circuit occurs from overlapping the state in which the switching element Q4 transitions from ON to OFF at the normal switching speed. However, as described below, in a case where noise occurs in the gate driving signal, the state in which the arm short circuit occurs may accidentally overlap the state in which the switching element transitions from ON to OFF at the normal switching speed.

Figure 5:
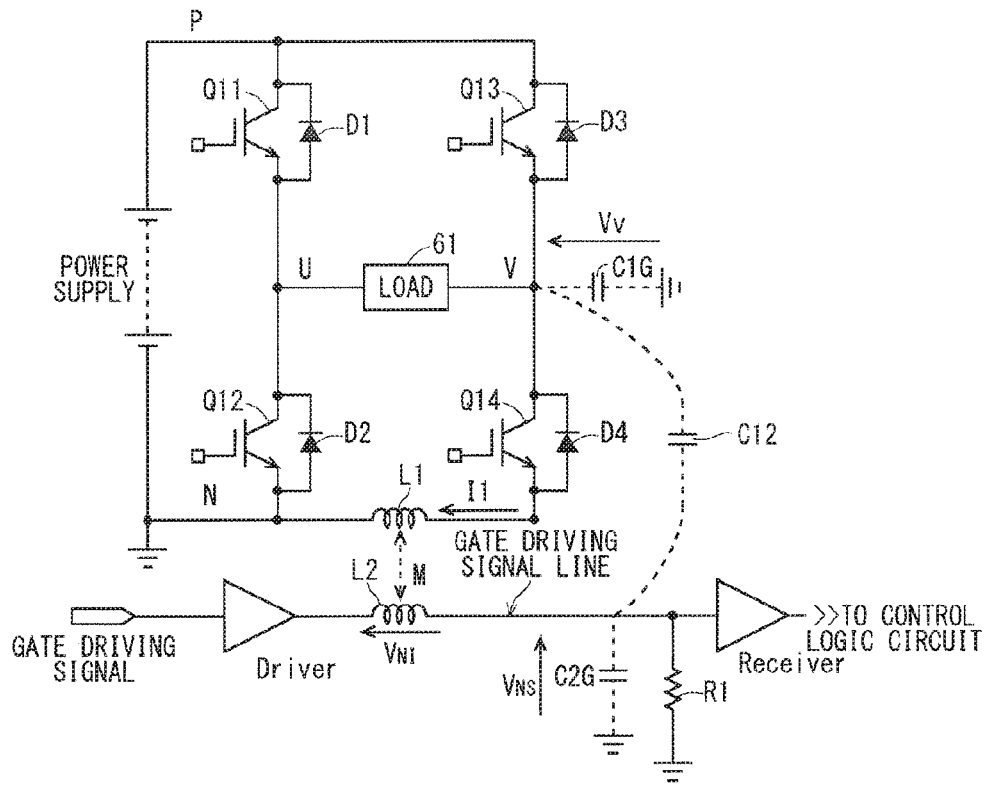
FIGS. 5A and 5B are diagrams illustrating a mechanism in which noise is generated in a gate driving signal.
Figure 5:
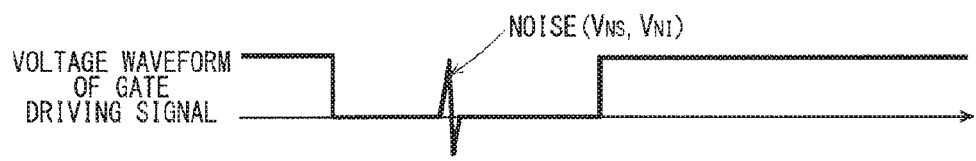

A mechanism for inducing the noise in wiring (hereinafter "gate driving signal wiring") that inputs the gate driving signal to the related drive protection circuit will be described next with reference to FIGS. 5A and 5B. In addition, FIGS. 5A and 5B illustrate the mechanism for inducing the noise in the gate driving signal wiring due to an operation of a circuit including switching elements Q11, Q12, Q13, Q14 in the form of an H-bridge. References of FIG. 5A are as follows.

[Description of Numerals of FIG. 5A]

$V_V$: potential of V portion, fluctuated by switching operation of Q13 and Q14

C1G: stray capacitance between V portion and ground

C12: stray capacitance between V portion and gate driving signal wiring

C2G: capacitance between gate driving signal wiring and ground

I1: current flowing through N bus bar

L1: parasitic inductance of N bus bar

L2: parasitic inductance of gate driving signal wiring

M: mutual inductance between N bus bar and gate driving signal wiring $V_{NS}$: induced voltage (noise) by capacitive coupling through C12

$V_{NI}$: induced voltage (noise) by electromagnetic coupling through M

For a switching operation of the switching elements Q11, Q12, Q13, Q14 (corresponding to the switching element Q4 or an external switching element), an induced voltage (noise) $V_{NS}$ by capacitive coupling through a stray capacitor (stray capacitance) C12 and a induced voltage (noise) $V_{NI}$ by electromagnetic coupling through a mutual inductance M between the gate driving signal wiring and the H-bridge circuit are superimposed on the gate driving signal. The noise $V_{NS}$ by the capacitive coupling is indicated by a following expression (2), the noise $V_{NS}$ at the time of high frequencies is indicated by a following expression (3), and the noise $V_{NI}$ by the electromagnetic coupling is indicated by a following expression (4).

[Math 2]

$$V_{NS} = \frac{j\omega C12}{j\omega(C12 + C2G) + 1/R1} V_V \quad (2)$$

[Math 3]

$$V_{NS} = \frac{C12}{C12 + C2G} V_V \quad (3)$$

[Math 4]

$$V_{NI} = j \times \omega \times M \times I1 \quad (4)$$

FIG. 5B illustrates an example of a voltage waveform of the gate driving signal on which the noises $V_{NS}$, $V_{NI}$ are superimposed. The switching speed of the switching elements Q11 to Q14 is increased and the voltage and the current fluctuate in a short time, thereby increasing amplitudes of the voltage waveforms of the noises $V_{NS}$, $V_{NI}$ and shortening generation time of the noises. In other words, the increase in the switching speed of the switching elements Q11 to Q14 makes the noises easy to be superimposed on the gate driving signal, thereby shortening the pulse widths of the noises.

A switching time of switching elements in a conventional inverter device is less than or equal to 1 µs, so that a pulse width of noise, which is less than or equal to 1 µs, is short. Thus, the noise, as shown in FIG. 5B, having the pulse width smaller (shorter) than the response time of the overcurrent protection circuit 50 may be input to the related drive protection circuit in the state where the noise is superimposed on the gate driving signal. In a case where such noise is input (period C shown in FIG. 2), there is no time for the protection operation by the soft cutoff function of the overcurrent protection circuit 50, whereby the gate driving circuit 2 performs the normal turn-off (abrupt hard cutoff in the period C shown in FIG. 2).

As a result, in the related drive protection circuit, the state in which the above-mentioned noise causes the switching element Q4 to transition from ON to OFF at the normal switching speed may accidentally overlap the state in which the arm short circuit occurs, and in this case, the great surge voltage may be generated, resulting in the adverse influence on the switching element Q4 or the like.

Figure 6:
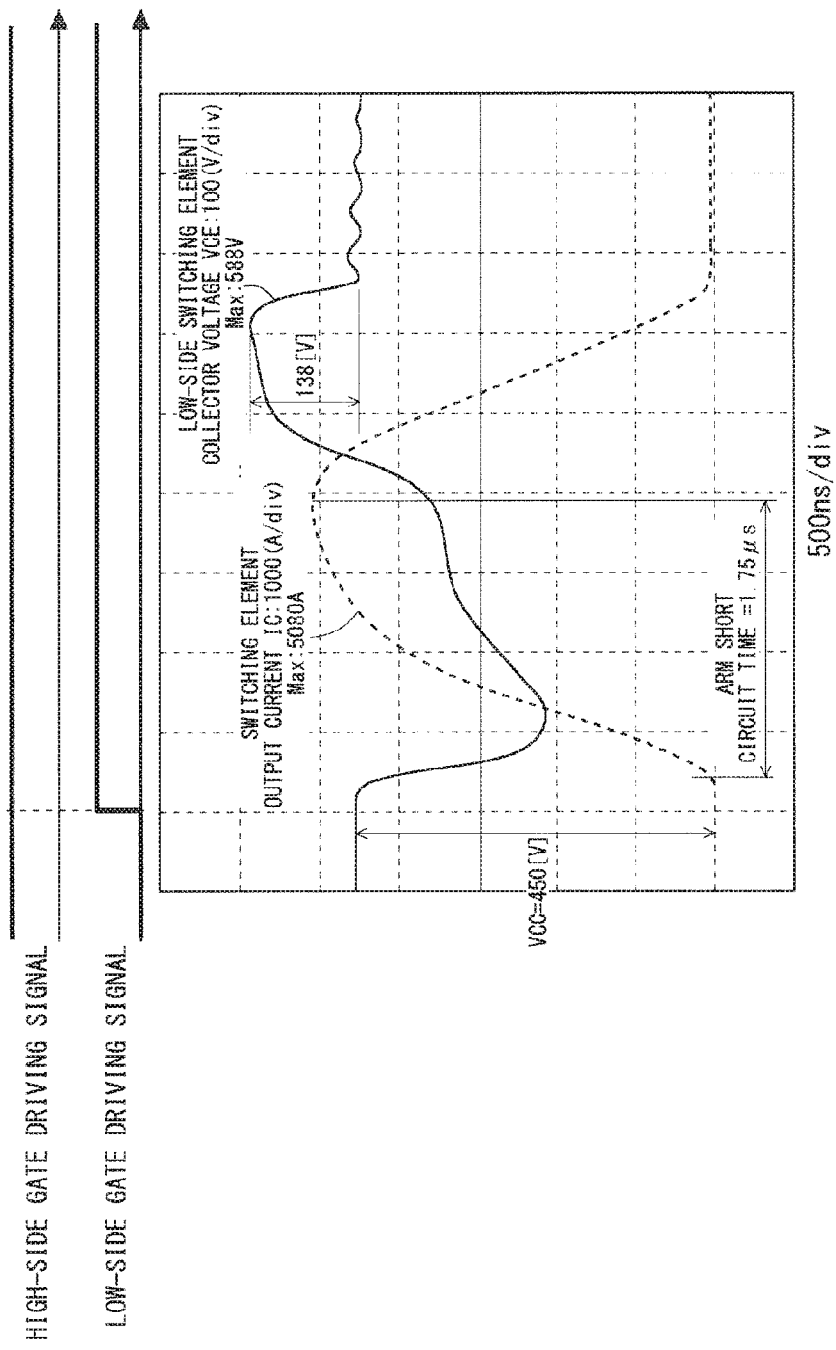
FIG. 6 is a diagram illustrating measured waveforms upon occurrence of the arm short circuit.
Figure 7:
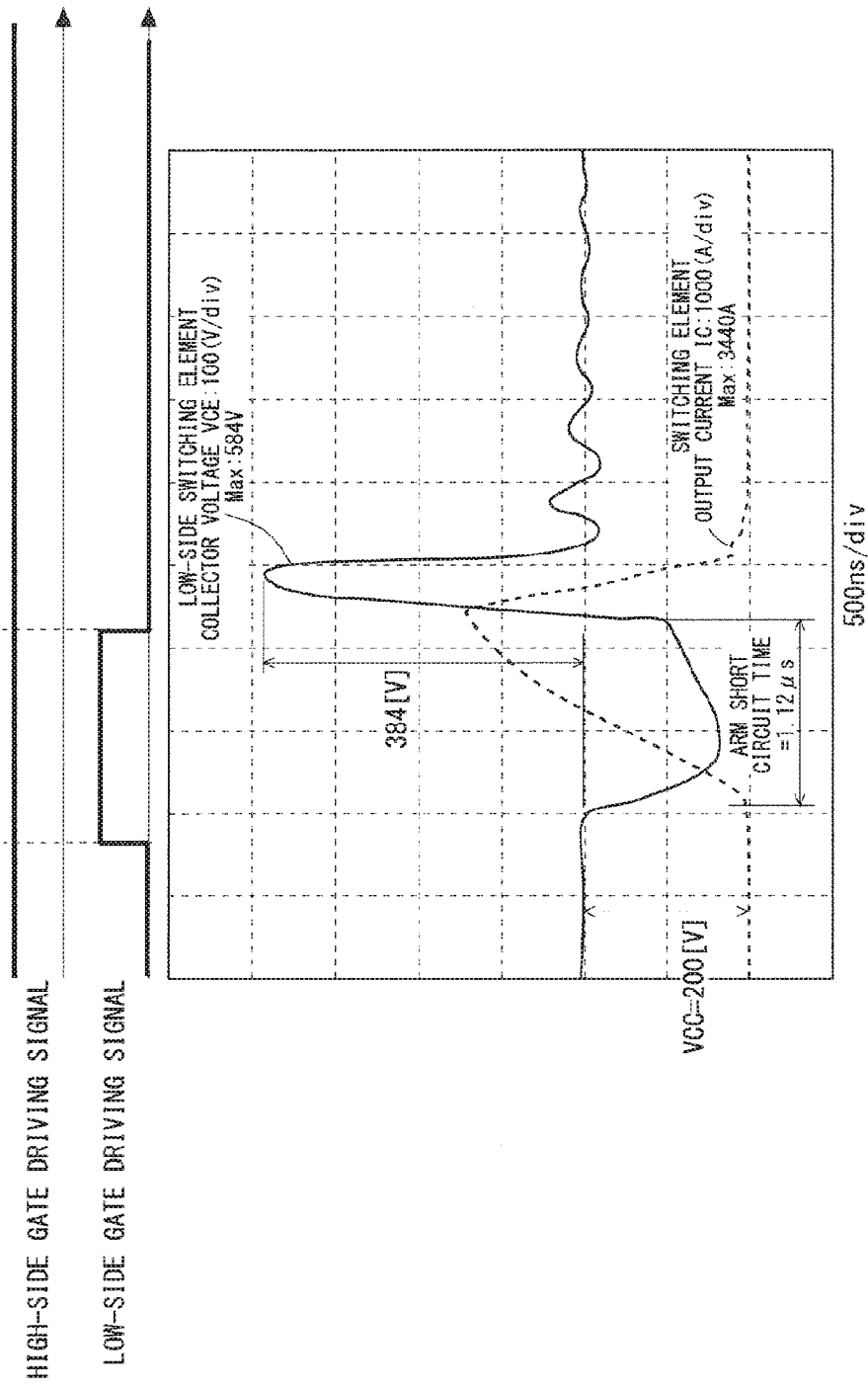
FIG. 7 is a diagram illustrating measured waveforms upon occurrence of the arm short circuit.

FIGS. 6 and 7 illustrate measured waveforms when the bridge configuration in FIG. 4 intentionally forms the arm short circuit. In addition, the arm short circuit is formed by firstly bringing a high-side element to the ON-state and subsequently bringing a low-side element to the ON-state.

FIG. 6 illustrates the measured waveforms in a case where the overcurrent protection circuit 50 performs the soft cutoff after the bridge configuration in FIG. 4 maintains the arm short circuit state for a fixed period of time. Herein, the switching elements have a rating of 600 V/600 A, a power supply voltage VCC is 450 V, and an arm short circuit time (a period of time for maintaining the arm short circuit state caused by the input of the noise having the pulse width) is 1.75 μs. Furthermore, the arm short circuit time is equal to the response time (herein the LPF delay described above+the first comparator output delay+the control logic circuit output delay) from starting to pass an arm short circuit current to starting the soft cutoff operation by the overcurrent protection circuit 50. The surge voltage (rise of collector voltage VCE), which is 138 V, generated in this case is relatively small and suppressed by the overcurrent protection circuit 50.

FIG. 7 illustrates the measured waveforms in a case of a reconstruction of the short-time short circuit on which the bridge configuration in FIG. 4 and the related drive protection circuit cannot perform the soft cutoff. Herein, the arm short circuit time is a period of time (for example, 1.12 μs) shorter than the response time of the overcurrent protection circuit 50, and the gate driving circuit 2 performs the normal cutoff (hard cutoff) on the assumption that the overcurrent protection circuit 50 does not perform the soft cutoff. In the example shown in FIG. 6, the switching element Q4 has the power supply voltage VCC of 450 V, but in the example shown in FIG. 7, the power supply voltage VCC is 200 V.

The surge voltage generated in this case is 384 V and is more than or equal to twice as much as that when the soft cutoff functions. Moreover, the power supply voltage VCC is 200 V herein, but if the power supply voltage VCC is 450 V similarly to that in FIG. 6, the maximum collector voltage VCE due to the surge voltage is more than or equal to 800 V, expecting breakdown of the switching element.

Figure 9:
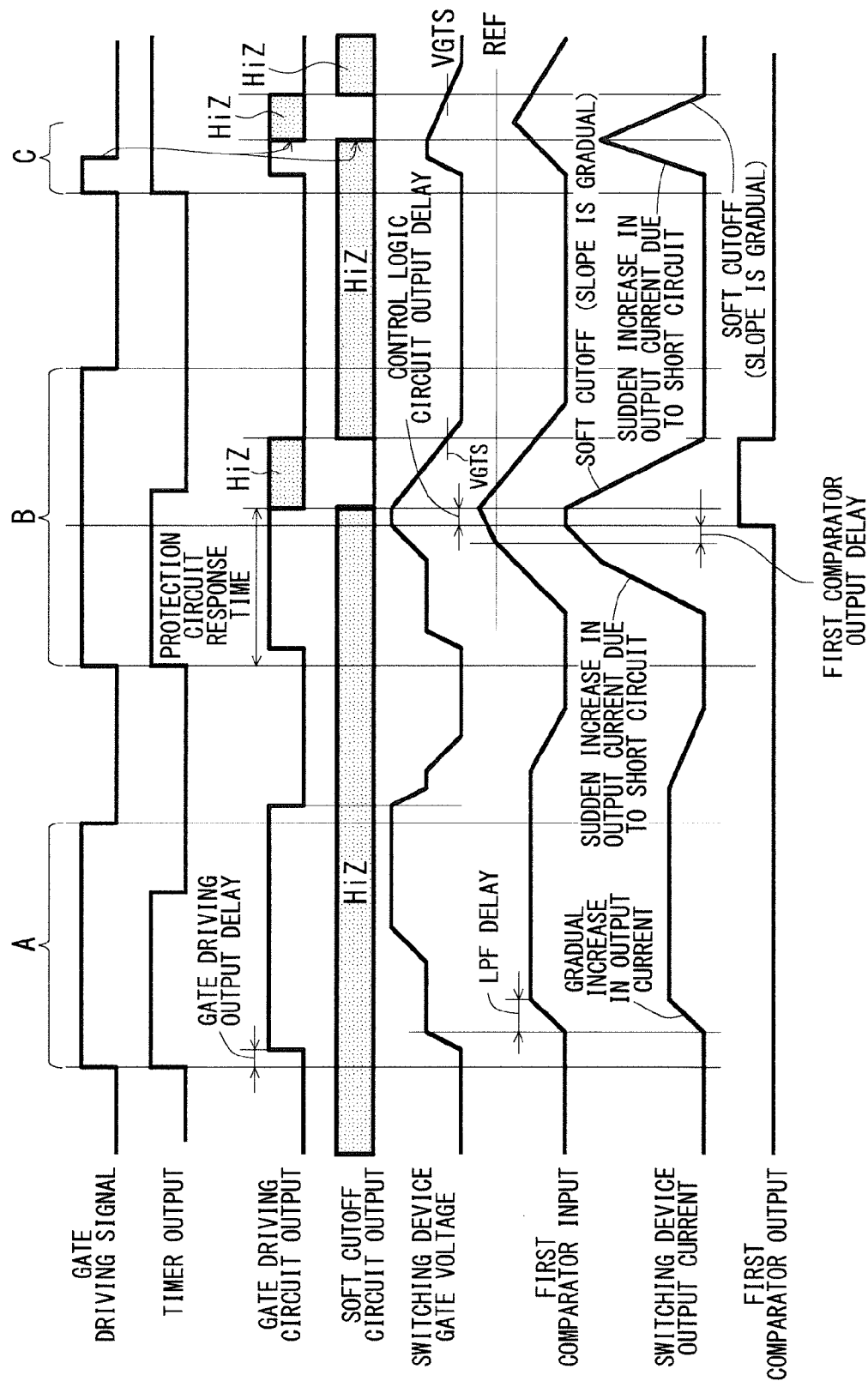
FIG. 9 is a diagram illustrating an operation timing of the drive protection circuit according to the first embodiment.

Thus, a drive protection circuit according to the first embodiment can perform the soft cutoff even in the case where the arm short circuit having the small pulse width occurs. FIG. 8 is a circuit diagram illustrating a configuration of the drive protection circuit according to the first embodiment, and FIG. 9 is a diagram illustrating an operation timing of the drive protection circuit.

The drive protection circuit according to the first embodiment is the above-mentioned related drive protection circuit to which a timer circuit (hereinafter referred to as an "ON-timer" or simply a "timer" (TIMER) in some cases) 11 that determines a period of time for maintaining the ON-state of the gate driving signal, a second comparator (comparison section) 12, and a power supply 13 having a reference voltage VGTS are added.

Of those, the second comparator 12 and the power supply 13 form a first gate voltage detector 52 that compares a gate voltage of the switching element Q4 with a gate threshold voltage (hereinafter a "gate threshold") of the switching element Q4.

Specifically, the reference voltage VGTS of the power supply 13 is set to a voltage less than or equal to the gate threshold of the switching element Q4. The second comparator 12 outputs L to the control logic circuit 8 in a case where the gate voltage of the switching element Q4 is an OFF-voltage less than the reference voltage VGTS, that is to say, less than the gate threshold of the switching element Q4. On the other hand, the second comparator 12 outputs H to the control logic circuit 8 in a case where the gate voltage of the switching element Q4 is an ON-voltage greater than the reference voltage VGTS, that is to say, greater than the gate threshold of the switching element Q4. Thus, the control logic circuit 8 can check the ON-state or the OFF-state of the switching element Q4 on the basis of the output from the second comparator 12 (first gate voltage detector 52).

The timer circuit 11 is triggered by the gate driving signal brought into ON to output a signal for keeping an H-state for a fixed period of time as shown in FIG. 9. The fixed period of time in which the output of the timer circuit 11 keeps the H-state is set equal or almost equal to the response time of the overcurrent protection circuit 50. In other words, the timer circuit 11 outputs the signal (predetermined signal) for keeping the H-state, from the timing of the gate driving signal brought into ON, for the fixed period of time equal to the response time of the overcurrent protection circuit 50. Here, the response time of the overcurrent protection circuit 50 set by the timer circuit 11 is a period of time more than or equal to a total time of (1) a gate driving output delay, (2) a switching element turn-on delay, (3) an output current rise time, (4) an LPF delay, (5) a first comparator output delay, and (6) a control logic circuit output delay, as shown in FIG. 10.

The control logic circuit 8 controls the gate driving circuit 2 and the soft cutoff circuit 3 on the basis of the gate driving signal, the output of the timer circuit 11, the output of the first comparator 6, and the output of the second comparator 11. Here, in a case where the noise having the pulse width smaller than the response time of the overcurrent protection circuit 50 is input together with the gate driving signal as in the period C shown in FIG. 9 (namely, the case where the signal for keeping the H-state is output from the timer circuit 11 and the gate driving signal is OFF), the control logic circuit 8 performs the soft cutoff in the soft cutoff circuit 3 regardless of the presence or absence of the overcurrent detection (output of the first comparator 6).

In other words, in the case where the pulse width of ON of the gate driving signal is less than or equal to the response time of the overcurrent protection circuit 50, the drive protection circuit according to the first embodiment operates the soft cutoff circuit 3 to cause the switching element Q4 to transition from ON to OFF regardless of the overcurrent.

Figures 11A, 11B:
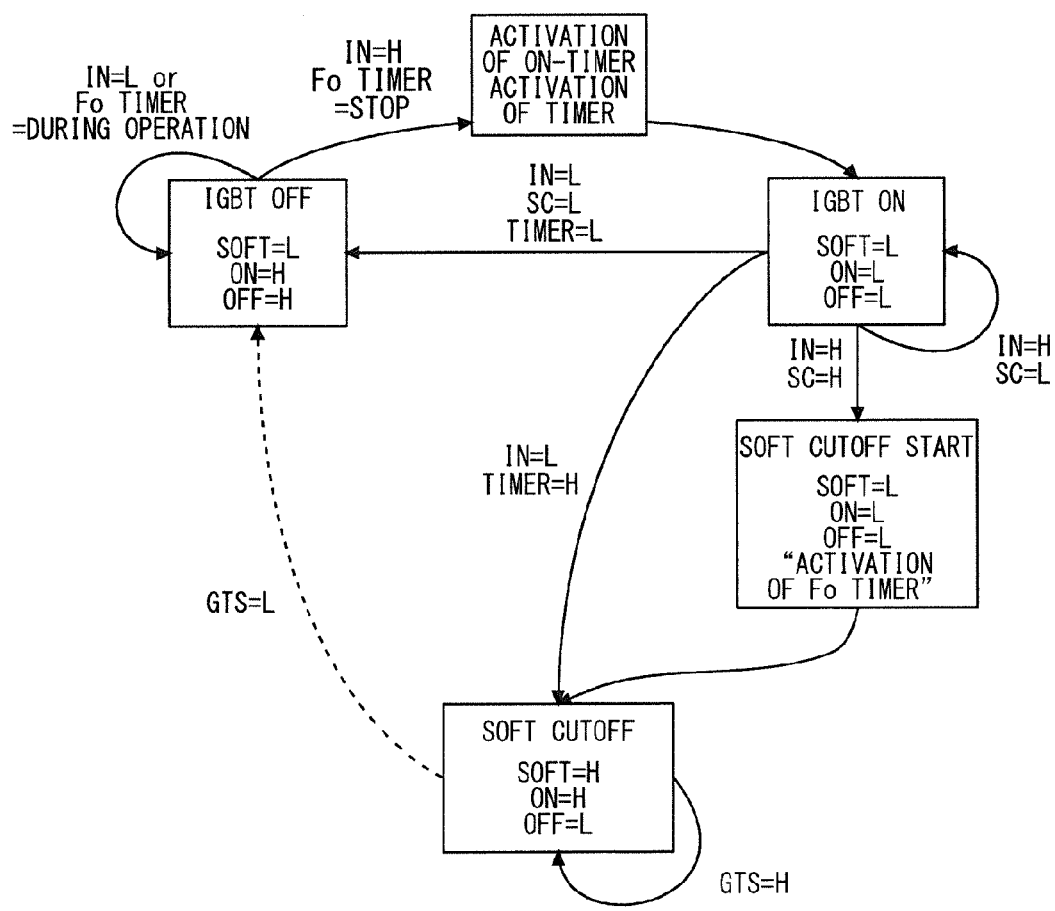
FIGS. 11A and 11B are diagrams illustrating an operation of the drive protection circuit according to the first embodiment.

FIG. 11A is a truth table of the control logic circuit 8 according to the first embodiment, and FIG. 11B is a state transition diagram of the control logic circuit 8.

Here, as compared with the state transition diagram (FIG. 3B) of the related drive protection circuit, in the drive protection circuit according to the first embodiment, a transition from the IGBT ON-state to the soft cutoff state is added to a case where the gate driving signal is OFF (IN=L) in the IGBT ON-state and the timer circuit 11 outputs H (TIMER=H, namely, during operation).

Moreover, as described with reference to FIG. 3B, the related drive protection circuit maintains the soft cutoff state until the count by the $F_O$ timer for the fixed period of time ends and the gate driving signal is brought into ON (IN=H). In other words, the $F_O$ timer sets the period of time for maintaining the soft cutoff state until the transition to the IGBT OFF-state.

In contrast, the drive protection circuit according to the first embodiment is configured to transition from the soft cutoff state to the IGBT OFF-state, as shown by a dashed arrow in FIG. 11B, regardless of ON and OFF of the gate driving signal if the gate voltage of the switching element Q4 is less than the gate threshold (output GTS of the second comparator 12=L) in the soft cutoff state. In other words, in the drive protection circuit according to the first embodiment, in the transition of the switching element Q4 to OFF by the soft cutoff circuit 3, the switching element Q4 is caused to transition to OFF by the gate driving circuit 2 instead of the soft cutoff circuit 3 in accordance with the comparison result of the second comparator 12.

Figure 12:
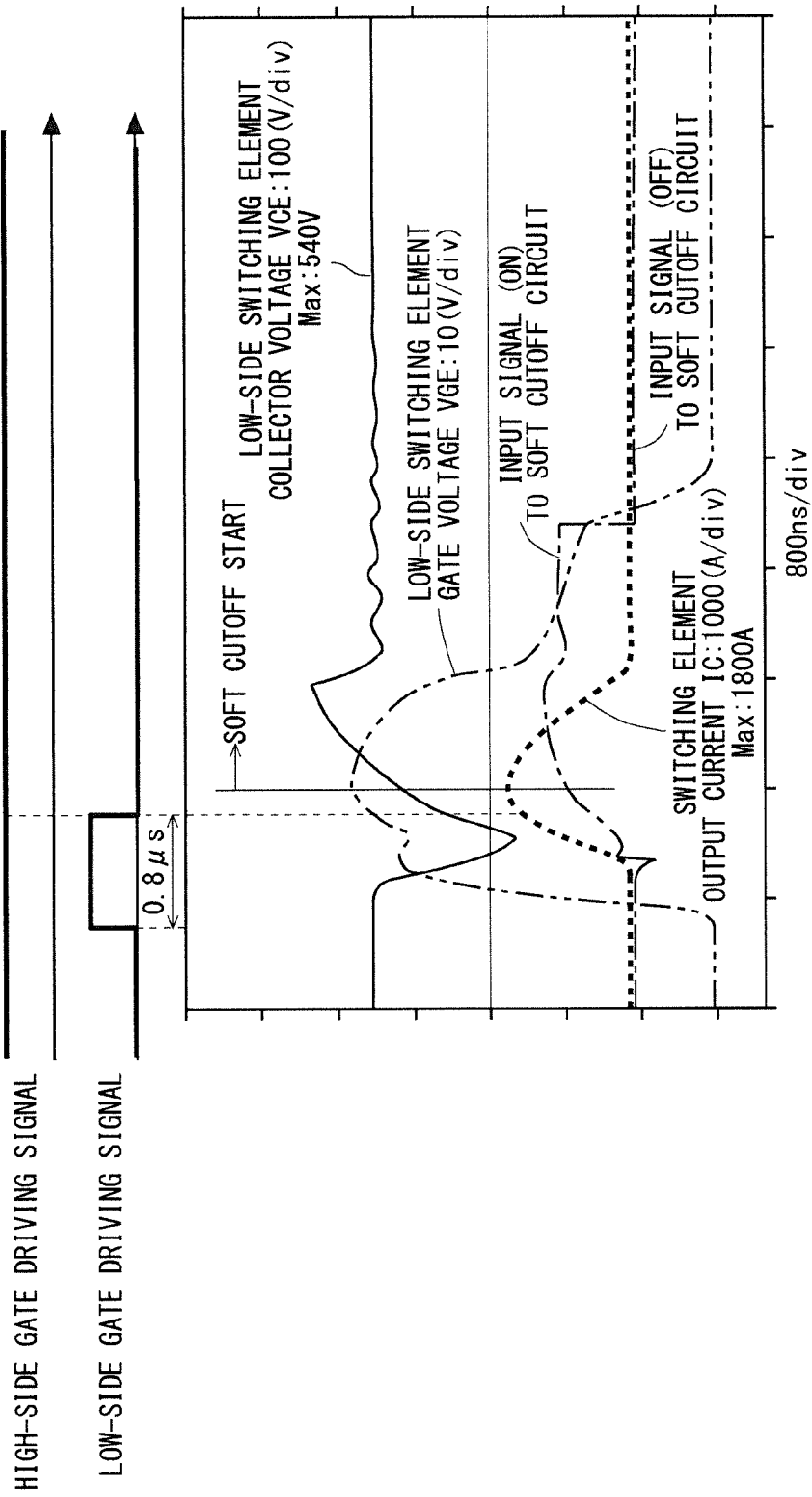
FIG. 12 is a diagram illustrating effects obtained by the drive protection circuit according to the first embodiment.

FIG. 12 illustrates measured waveforms in a case where the drive protection circuit according to the first embodiment is applied to reconstruct a short-time short circuit of 0.8 μs, which is shorter than that shown in FIG. 7 (note that the power supply voltage VCC is 450 V). The soft cutoff circuit 3 that does not operate in the related drive protection circuit shown in FIG. 7 operates in the example shown in FIG. 12.

In this manner, the drive protection circuit according to the first embodiment causes the soft cutoff circuit 3 to operate regardless of the overcurrent in the case where the pulse width of ON of the gate driving signal is less than or equal to the response time of the overcurrent protection circuit 50. Therefore, even in the case where the noise having the small pulse width is generated, the soft cutoff that slackens a decrease (slope) of a collector current IC upon turn-off of the switching element Q4 can be performed, whereby the surge voltage (rise of the collector voltage VCE) can be reliably suppressed. As a result, for example, the maximum collector voltage VCE can be kept less than or equal to the rated voltage, whereby the adverse influence on the switching element Q4 caused by the surge voltage can be suppressed.

For the gate voltage VGE of the switching element Q4 less than or equal to the gate threshold (herein 4V) in the first embodiment, an input signal to the soft cutoff circuit 3 is switched stepwise from ON to OFF, as shown in FIG. 12, while an input signal to the gate driving circuit 2 is switched stepwise from OFF to ON, which is not shown. Thus, for the gate voltage VGE of the switching element Q4 less than or equal to the gate threshold (herein 4V), the circuit which sinks the switching element Q4 is switched from the soft cutoff circuit 3 to the gate driving circuit 2, thereby abruptly decreasing the gate voltage VGE, as shown in FIG. 12.

Next, effects obtained through such operation and action will be described with reference to FIG. 13. FIG. 13 is a diagram illustrating a mechanism of a gate malfunction that may occur due to a displacement current flowing through a feedback capacitance $C_{res}$ of the IGBT (switching element Q4). When a gate voltage of a switching element Q4b is sunk by the soft cutoff circuit 3, a switching element Q4a facing the switching element Q4b is turned ON, increasing a collector voltage of the switching element Q4b.

The increase in the collector voltage increases the voltage of the feedback capacitance $C_{res}$ between the collector and the gate of the switching element Q4b, and a displacement current $I_{res}$, as shown in FIG. 13, flows therebetween. The displacement current $I_{res}$ flows through a resistor $RG_{soft}$ of the soft cutoff circuit 3, so that the gate voltage of the switching element Q4 is increased to $I_{res} \times RG_{soft}$. If this gate voltage exceeds the gate threshold of the switching element Q4b, a malfunction of the switching element Q4b turned ON occurs, possibly leading to occurrence of the arm short circuit (arm short circuit current) in the switching elements Q4a, Q4b.

In contrast, for the gate voltage VGE of the switching element Q4 less than or equal to the gate threshold in the first embodiment, the switching element Q4 is caused to transition to OFF by the gate driving circuit 2 instead of the soft cutoff circuit 3. Thus, the sink of the gate voltage of the switching element Q4 can be performed, at a timing earlier than that of the related drive protection circuit, using the gate driving circuit 2 that includes the resistor RG having the resistance value less than that of the resistor $RG_{soft}$ of the soft cutoff circuit 3, whereby the malfunction mentioned above can be suppressed.

The drive protection circuit according to the first embodiment as described above also operates the soft cutoff circuit 3 in the normal operation without the noise (for example, a case where the higher system sets such that the pulse width of ON of the gate driving signal is smaller than the time in which the timer circuit 11 keeps the H-state). In this case, however, the gate driving circuit 2 turns OFF the switching element Q4 at the relatively early timing, as mentioned above. This can reduce an influence (operational influence, influence of a switching loss or the like) on the other structural components due to the operation of the soft cutoff circuit 3 in the normal operation, whereby an influence on the higher system side can also be reduced.

Unlike this embodiment, the similar effects can also be obtained if the MOSFET, instead of the bipolar transistor, is used for the switching elements Q2, Q3 of the gate driving circuit 2. In this case, the gate driving circuit 2 can be formed of a source follower of one transistor each on an ON-side and on an OFF-side, so that a configuration of a circuit can be simplified and the number of parts can be reduced. Therefore, the switching characteristics of the switching element Q4 and suppression of the short circuit current can be achieved in a relatively small mounting area. Also in this embodiment, the IGBT is used as the switching element Q4, but a MOSFET formed of a silicon (Si) or a SiC-MOSFET formed of a silicon carbide (SiC) may be used as a power device. The SiC-MOSFET has a short turn-on time, so that the surge voltage tends to be increased. Therefore, the application of this embodiment can effectively suppress the surge voltage and protect the switching element Q4.

The drive protection circuit has been described above, and a semiconductor module including the drive protection circuit and the switching element Q4 (switching device 1) protected by the drive protection circuit can also obtain the similar effects described above.

Second Embodiment

FIG. 14 is a circuit diagram illustrating a configuration of a drive protection circuit according to a second embodiment of the present invention, and FIG. 15 is a diagram illustrating an operation timing of the drive protection circuit. In the drive protection circuit according to the second embodiment, the same components as or similar components to those described in the first embodiment are denoted by the same references, and differences are mainly described below.

The drive protection circuit according to the second embodiment is the drive protection circuit according to the first embodiment as shown in FIG. 8 provided with a third comparator 16 and a power supply 17 having a reference voltage $V_{mirror}$, instead of the timer circuit 11.

In the drive protection circuit according to the second embodiment having such configuration, a mirror period of the switching element Q4 is used instead of the response time of the overcurrent protection circuit 50 as described above. In other words, in a case where the pulse width of ON of the gate driving signal is less than or equal to a mirror period of the switching element Q4, the second embodiment operates the soft cutoff circuit 3 to cause the switching element Q4 to transition from ON to OFF regardless of the overcurrent. Next, the drive protection circuit according to the second embodiment will be described in detail.

The third comparator 16 and the power supply 17 form a second gate voltage detector 53 that compares the gate voltage of the switching element Q4 with a voltage during the mirror period of the switching element Q4.

Specifically, the reference voltage $V_{mirror}$ of the power supply 17 is set to a voltage (namely, the voltage between the gate threshold of the switching element Q4 and the power supply voltage of the gate driving circuit 2) during the mirror period of the switching element Q4. The third comparator 16 outputs L to the control logic circuit 8 in a case where the gate voltage of the switching element Q4 is less than the reference voltage $V_{mirror}$, that is to say, less than the voltage during the mirror period. On the other hand, the third comparator 16 outputs H to the control logic circuit 8 in a case where the gate voltage of the switching element Q4 is greater than the reference voltage $V_{mirror}$, that is to say, greater than the voltage during the mirror period.

Figure 16:
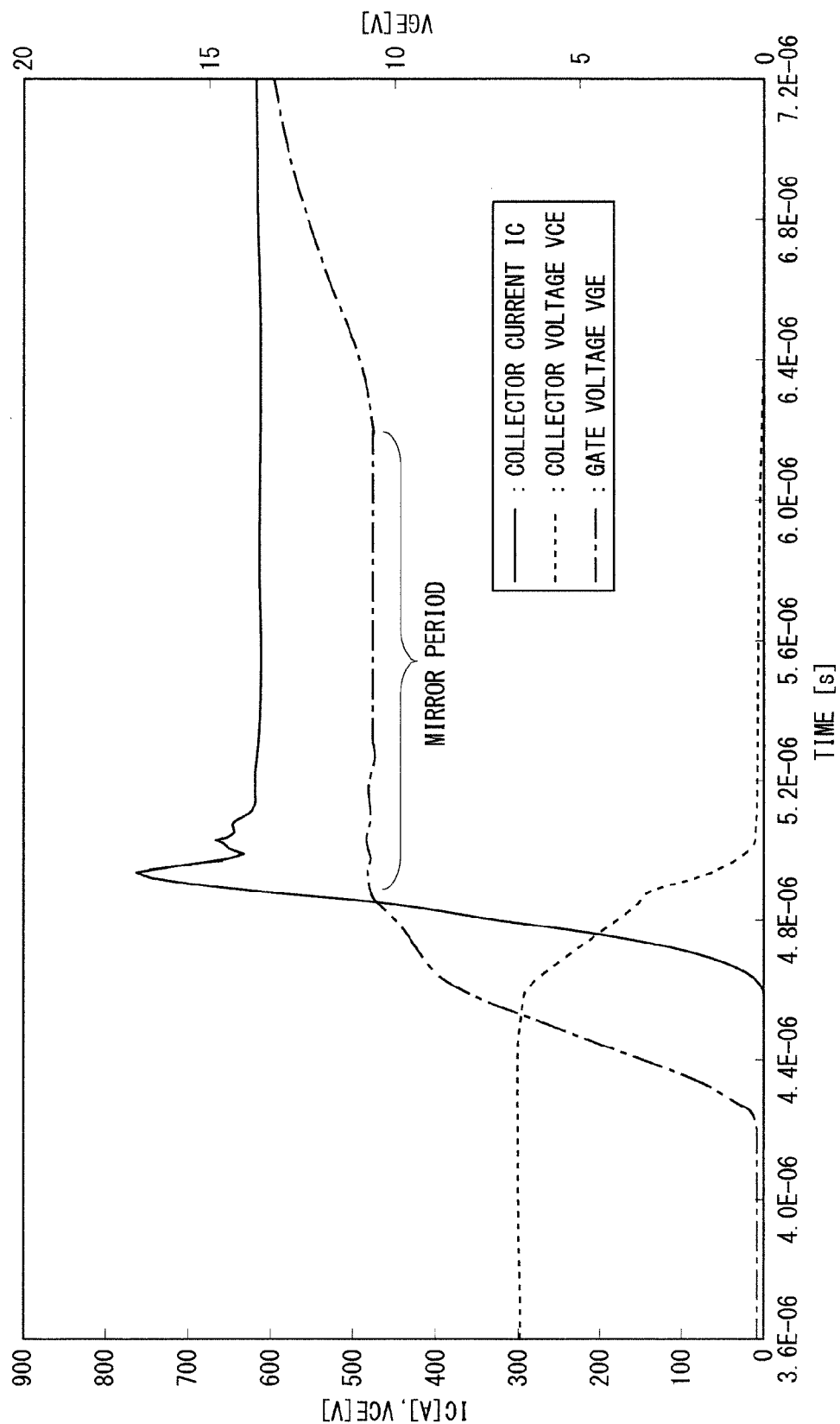
FIG. 16 is a diagram illustrating a mirror period.

Here, the mirror period is described with reference to FIG. 16. FIG. 16 is a diagram illustrating a turn-on waveform of a switching element. As shown in FIG. 16, there is the mirror period in which the gate voltage is a constant value immediately after the turn-on of the switching element. In this mirror period, a decrease in the collector voltage VCE changes a feedback capacitance between a collector and an emitter, and thus a displacement current flows through the feedback capacitance side from the gate due to this change. Consequently, in the circuit shown in FIG. 14, the gate current and the gate voltage that flow through the gate of the switching element Q4 from the gate driving circuit 2 are almost constant during the mirror period.

In addition, this mirror period has a length of approximately several μs, the length being almost equal to the response time of the overcurrent protection circuit 50 described in the first embodiment. Moreover, the length of this mirror period can be changed to some extent by a gate driving circuit output voltage and a gate resistance value. Specifically, upon the turn-on, the gate driving circuit output voltage is increased, or the gate resistance value is reduced to increase the gate current, thereby shortening the mirror period. Conversely, the gate driving circuit output voltage is reduced, or the gate resistance value is increased to reduce the gate current, thereby increasing the mirror period. Then, in the second embodiment, this mirror period is adjusted to make a delay time (herein a total time of the LPF delay, the first comparator output delay, and the control logic circuit output delay) of the overcurrent protection circuit 50 identical to or shorter than the mirror period.

Figure 17:
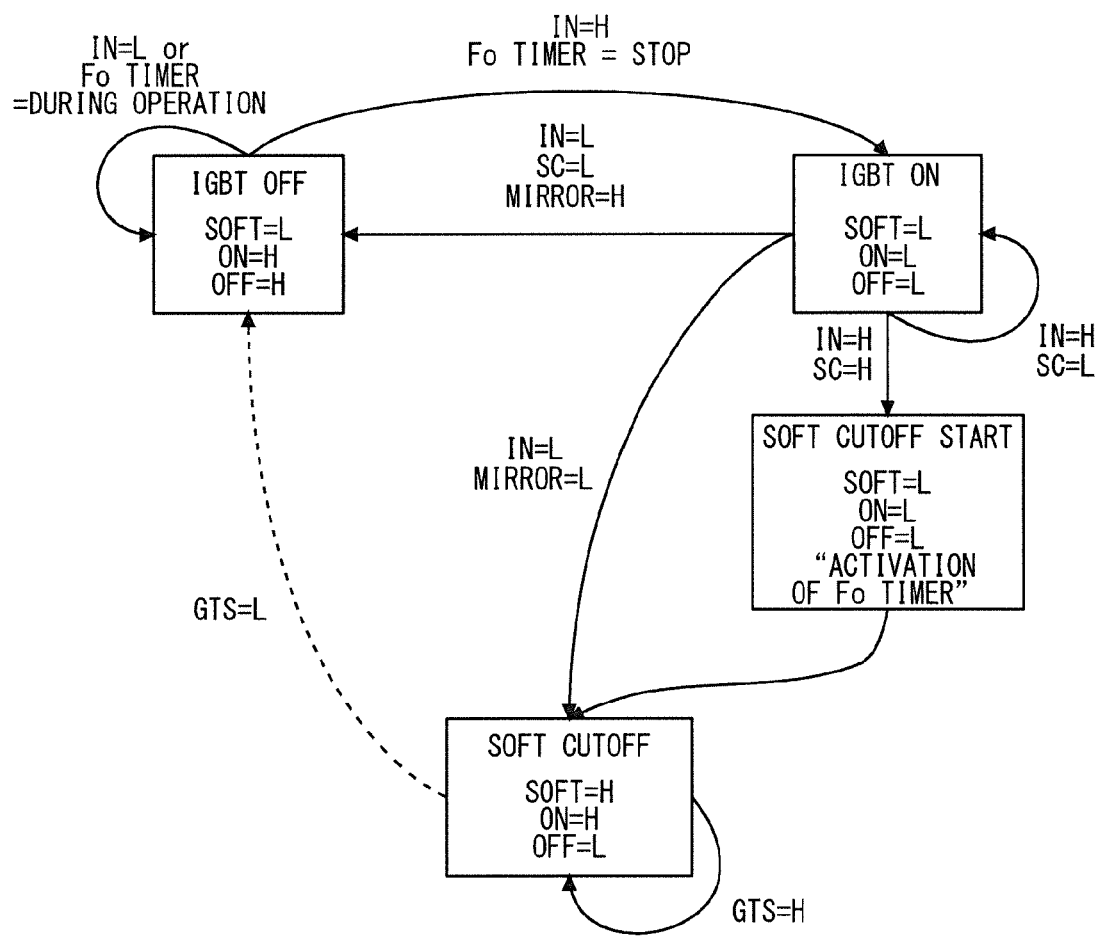
FIG. 17 is a diagram illustrating an operation of the drive protection circuit according to the second embodiment.

FIG. 17 is a state transition diagram of the control logic circuit 8 according to the second embodiment. The drive protection circuit according to the second embodiment transitions from the IGBT ON-state to the soft cutoff state in a case where the gate driving signal is brought into OFF in the IGBT ON-state (IN=L) and the third comparator 16 outputs L (MIRROR=L). In other words, it is the same as the state transition diagram of the drive protection circuit according to the first embodiment shown in FIG. 11B in which TIMER is replaced by MIRROR and H and L are reversed. A truth table of the control logic circuit 8 according to the second embodiment, which is not shown, is the same as the truth table of the first embodiment in which TIMER is similarly replaced by MIRROR and H and L are reversed.

The drive protection circuit according to the second embodiment similar to the drive protection circuit according to the first embodiment can reliably suppress the surge voltage even in the case where the noise having the small pulse width is generated. Moreover, the second gate voltage detector 53 (the third comparator 16 and the power supply 17) has the circuit configuration more simple than that of the timer circuit 11 used in the first embodiment, expecting simplification and miniaturization of the circuit.

Third Embodiment

Figure 18:
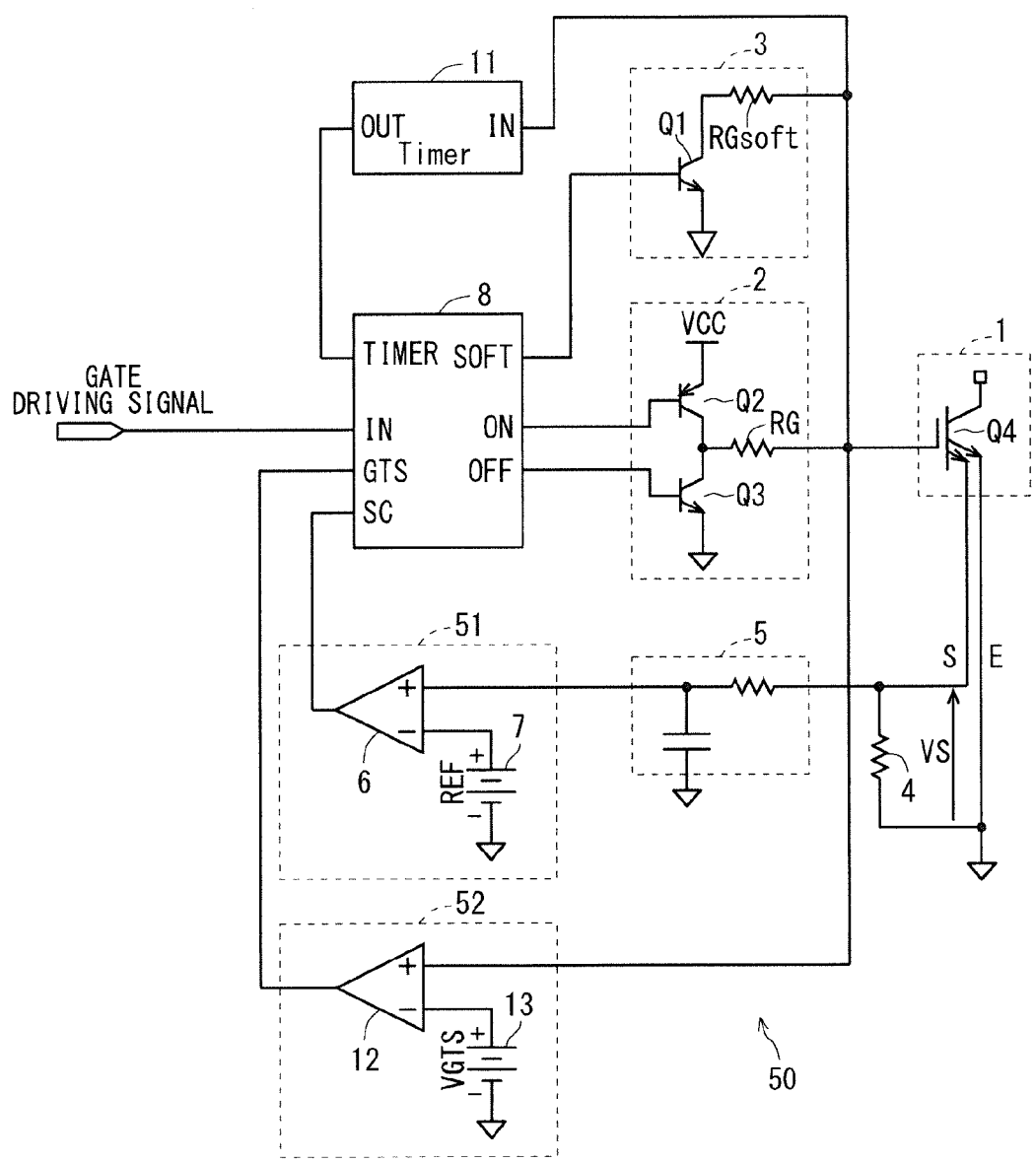
FIG. 18 is a circuit diagram illustrating a configuration of a drive protection circuit according to a third embodiment.
Figure 19:
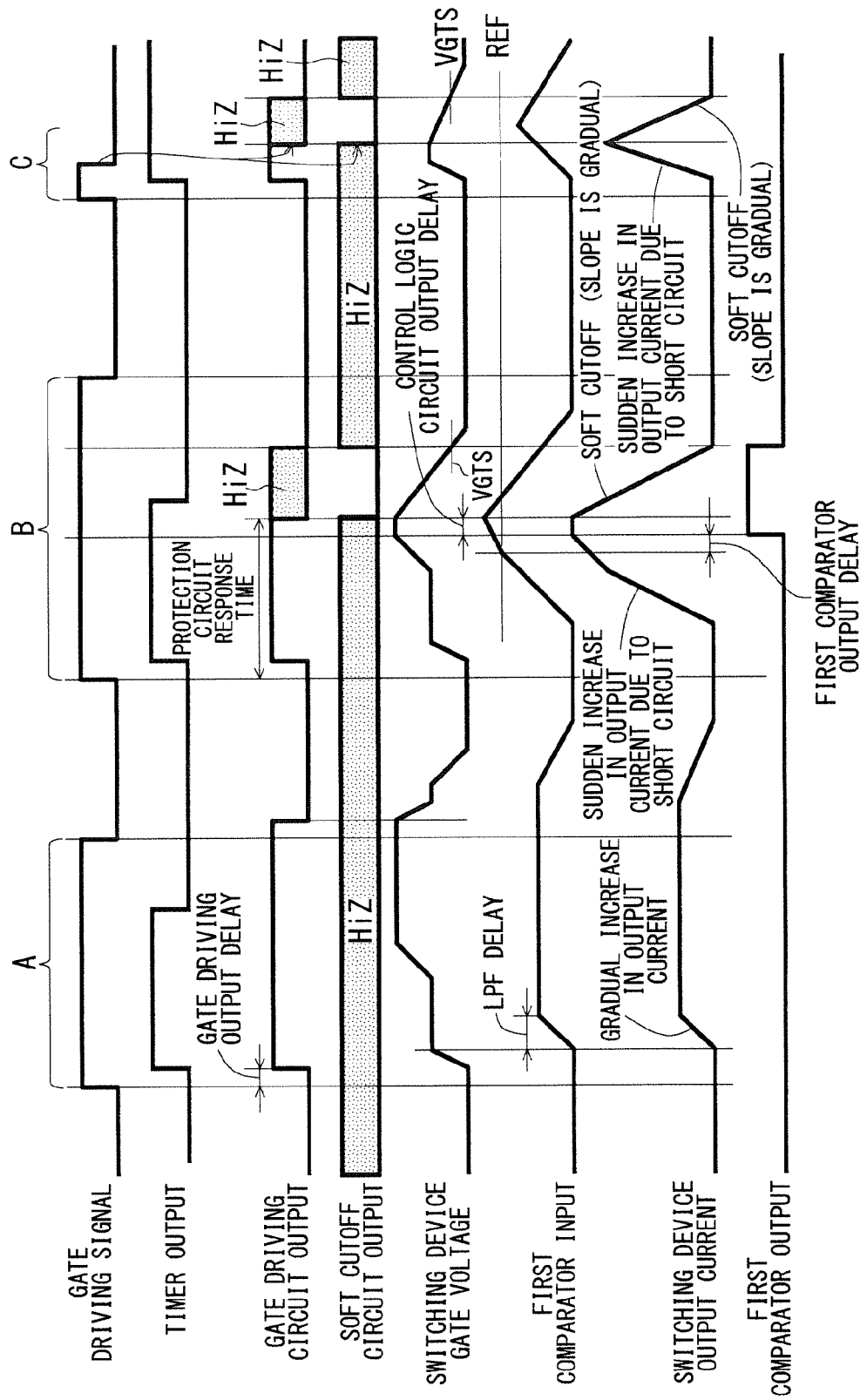
FIG. 19 is a diagram illustrating an operation timing of the drive protection circuit according to the third embodiment.

FIG. 18 is a circuit diagram illustrating a configuration of a drive protection circuit according to a third embodiment of the present invention, and FIG. 19 is a diagram illustrating an operation timing of the drive protection circuit. In the drive protection circuit according to the third embodiment, the same components as or similar components to those described in the first embodiment are denoted by the same references, and differences are mainly described below.

The drive protection circuit according to the third embodiment is the drive protection circuit according to the first embodiment shown in FIG. 8 in which the timer circuit 11 receives the gate voltage of the switching element Q4 instead of the gate driving signal.

In the drive protection circuit according to the third embodiment having such configuration, a period of time (hereinafter "rise-to-off time") from rising of the gate voltage of the switching element Q4a to turning OFF the gate driving signal is used instead of the pulse width of ON of the above-mentioned gate driving signal. In other words, in a case where the rise-to-off time is less than or equal to the response time of the overcurrent protection circuit 50, the third embodiment operates the soft cutoff circuit 3 to cause the switching element Q4 to transition from ON to OFF regardless of the overcurrent. Next, the drive protection circuit according to the third embodiment will be described in detail.

The timer circuit 11 has a voltage set less than or equal to the voltage during the mirror period of the switching element Q4. The mirror period starts and the gate voltage of the switching element Q4 is more than or equal to the voltage set in the timer circuit 11, and then the timer circuit 11 outputs the signal for keeping the H-state to the control logic circuit 8 for a fixed period of time. Also in the third embodiment similar to the first embodiment, the fixed period of time in which the output of the timer circuit 11 keeps the H-state is set almost equal to the response time of the overcurrent protection circuit 50.

Figure 20:
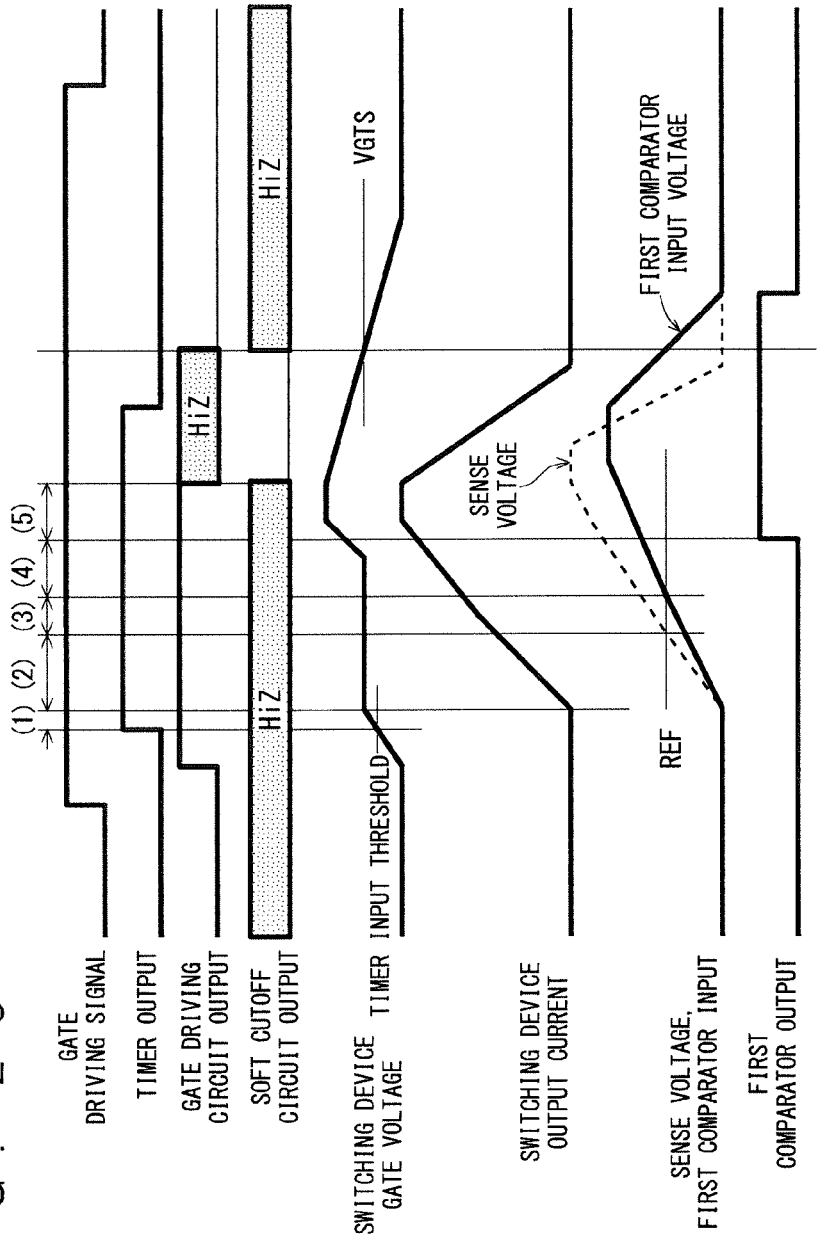
FIG. 20 is a diagram illustrating an operation timing of the drive protection circuit according to the third embodiment.

In the third embodiment, however, the response time of the overcurrent protection circuit 50 set in the timer circuit 11 is a period of time more than or equal to a total time of (1) a gate voltage rise time of the switching element Q4 (a period of time from the point in which the timer circuit 11 outputs H to the start of the mirror period, that is, a period of time between timer input threshold voltage and mirror period voltage), (2) an output current rise time, (3) an LPF delay, (4) a first comparator output delay, and (5) a control logic circuit output delay, as shown in FIG. 20.

As in a period C shown in FIG. 19, in a case where the noise having the pulse width smaller than the response time of the overcurrent protection circuit 50 is input together with the gate driving signal (namely, the case where the output signal of the timer circuit 11 is in the H-state and the gate driving signal is OFF), the control logic circuit 8 performs the soft cutoff in the soft cutoff circuit 3 regardless of the presence or absence of the overcurrent detection. In addition, the truth table and the state transition diagram of the control logic circuit 8 according to the third embodiment are similar to those in the first embodiment.

The drive protection circuit according to the third embodiment similar to the drive protection circuit according to the first embodiment can reliably suppress the surge voltage even in the case where the noise having the small pulse width is generated. Moreover, the third embodiment eliminates an influence caused by a variation in the delay time between the control logic circuit 8, the gate driving circuit 2, and the switching element Q4. For example, the gate driving circuit 2, which is an emitter connection of the bipolar transistor in the configuration shown in FIG. 18, is not influenced even by substitution of a collector grounded configuration and a MOSFET or by modification to the resistor RG of the gate driving circuit 2. Therefore, the design modification can be easily performed.

Also in a case where the pulse width superimposed on the gate driving signal is extremely small, the gate driving signal may be in an OFF-state before the switching device 1 (switching element Q4) enters the mirror period. In this case, the switching element Q4 is not turned ON and the arm short circuit does not occur in the first place, whereby the soft cutoff operation is not conceivably needed, but in the third embodiment, the timer circuit 11 is not H (during operation), whereby the soft cutoff operation is not necessarily performed. Furthermore, the gate voltage of the switching element Q4 can be sunk by the gate driving circuit 2.

Fourth Embodiment

FIG. 21 is a diagram illustrating an automobile 81 in which a drive protection circuit 71 is installed according to a fourth embodiment of the present invention. In the fourth embodiment, the same components as or similar components to those described in the first embodiment are denoted by the same references.

Any of the drive protection circuits described in the first to third embodiments is applied to the drive protection circuit 71. Except for the drive protection circuit 71, an engine control unit (ECU) 72 being a higher system of the drive protection circuit 71, a low-voltage power supply 73 used for the drive protection circuit 71, a regenerative motor 74 that is a motor capable of outputting more than or equal to 1 kW for a hybrid automobile, an electric-powered automobile, a fuel cell automobile, or an automobile provided with a starter-generator, an engine 75 driven by the regenerative motor 74, a high-voltage power supply 76, and an inverter device 77 are installed in the automobile 81 shown in FIG. 21.

The inverter device 77 including the switching element Q4 driven and protected by the drive protection circuit 71 converts a direct-current voltage of the high-voltage power supply 76 to an alternating-current voltage for driving the regenerative motor 74 and converts an alternating-current voltage generated by the regenerative motor 74 to a direct-current voltage chargeable in the high-voltage power supply 76.

In the automobile 81 as described above, not only a state in which power running and regeneration are alternately repeated and a load variation of the regenerative motor 74 is great but also a coasting state in which power running and regeneration are not performed frequently occur. In the latter coasting state, the inverter device 77 that drives the regenerative motor 74 is almost in no-load operation, and the output current does not completely flow or has a slight value of approximately several tenths to several hundredths of the rated current.

In such operation, a switching speed of a switching element in the inverter device 77 is faster than that when the normal power running and regeneration are performed. As a result, the mechanism as shown in FIGS. 5A and 5B superimposes, on the gate driving signal input in the drive protection circuit, the induced voltage (noise) by the electromagnetic coupling due to the high-frequency current, possibly leading to a malfunction.

To prevent the noise, a magnetic shield is effective, but a shielding material used for the magnetic shield has problems such as a high cost and a heavy weight, so that the magnetic shield has not been sufficiently performed.

In the fourth embodiment, as the drive protection circuit 71, the drive protection circuits described in the first to third embodiments, that is to say, the drive protection circuit capable of reliably suppressing the surge voltage is applied, even in the case where the noise having the small pulse width is generated. Therefore, the high cost and heavy weight are suppressed, and the adverse influence on the switching element Q4 in the inverter device 77 installed in the automobile 81 can be suppressed.

In addition, according to the present invention, the above embodiments can be arbitrarily combined, or each embodiment can be appropriately varied or omitted within the scope of the invention.

While the invention has been shown and described in detail, the foregoing description is in all aspects illustrative and not restrictive. The present invention is not restricted to that. It is therefore understood the numerous modifications and variations can be devised without departing from the scope of the invention.

DESCRIPTION OF NUMERALS

2 gate driving circuit; 3 soft cutoff circuit; 11 timer circuit; 12 second comparator; 50 overcurrent protection circuit; 71 drive protection circuit; 74 regenerative motor; 77 inverter device; 81 automobile; Q4 switching element.

The invention claimed is:

1. A drive protection circuit that drives and protects a switching element, comprising:
   a drive circuit that drives said switching element in response to an input signal; and
   an overcurrent protection circuit that operates a soft cutoff circuit upon an overcurrent of said switching element, said soft cutoff circuit causing said switching element to transition from ON to OFF at a switching speed slower than that of said drive circuit,
   wherein in a case where a pulse width of ON of said input signal is less than or equal to a response time of said overcurrent protection circuit, said drive protection circuit operates said soft cutoff circuit to cause said switching element to transition from ON to OFF, regardless of said overcurrent.

2. The drive protection circuit according to claim 1, further comprising a timer circuit that outputs a predetermined signal, from a timing of said input signal brought into ON, for a fixed period of time equal to the response time of said overcurrent protection circuit,
   wherein in a case where said predetermined signal is output from said timer circuit and said input signal is OFF, said drive protection circuit operates said soft cutoff circuit to cause said switching element to transition from ON to OFF, regardless of said overcurrent.

3. The drive protection circuit according to claim 1, wherein a mirror period of said switching element is used instead of said response time.

4. The drive protection circuit according to claim 1, wherein a period of time from rising of a gate voltage of said switching element to turning OFF said input signal is used instead of the pulse width of ON of said input signal.

5. The drive protection circuit according to claim 1, further comprising a comparator that compares a gate threshold of said switching element with a gate voltage of said switching element,
   wherein in the transition of said switching element to OFF by said soft cutoff circuit, said drive protection circuit operates said drive circuit instead of said soft cutoff circuit to cause said switching element to transition to OFF, in accordance with a comparison result of said comparator.

6. The drive protection circuit according to claim 1, wherein said switching element is included in an inverter device that drives a motor installed in an automobile.

7. A semiconductor module, comprising:
the drive protection circuit according to claim 1; and
said switching element.

8. An automobile, comprising:
the drive protection circuit according to claim 1; and
said switching element included in an inverter device that drives a motor.

* * * * *